(12) United States Patent
Yang et al.

(10) Patent No.: US 12,249,531 B2
(45) Date of Patent: Mar. 11, 2025

(54) METHOD FOR FORMING SEMICONDUCTOR STRUCTURE

(71) Applicant: Taiwan Semiconductor Manufacturing Company, Ltd., Hsinchu (TW)

(72) Inventors: Chih-Hsin Yang, Zhubei (TW); Dian-Hau Chen, Hsinchu (TW); Yen-Ming Chen, Hsin-Chu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 403 days.

(21) Appl. No.: 17/738,182

(22) Filed: May 6, 2022

(65) Prior Publication Data

US 2023/0360946 A1 Nov. 9, 2023

(51) Int. Cl.
*H01L 21/683* (2006.01)
*H01L 23/00* (2006.01)
*H01L 49/02* (2006.01)

(52) U.S. Cl.
CPC .......... *H01L 21/6835* (2013.01); *H01L 24/03* (2013.01); *H01L 24/05* (2013.01); *H01L 24/08* (2013.01); *H01L 24/80* (2013.01); *H01L 24/13* (2013.01); *H01L 28/87* (2013.01); *H01L 2221/68304* (2013.01); *H01L 2221/68363* (2013.01); *H01L 2221/68368* (2013.01); *H01L 2221/68381* (2013.01); *H01L 2224/0346* (2013.01); *H01L 2224/03622* (2013.01); *H01L 2224/03845* (2013.01); *H01L 2224/0557* (2013.01); *H01L 2224/05624* (2013.01); *H01L 2224/05647* (2013.01); *H01L 2224/05655* (2013.01); *H01L 2224/05657* (2013.01); (Continued)

(58) Field of Classification Search
CPC ....... H01L 21/6835; H01L 2221/68304; H01L 2221/68363; H01L 2221/68368; H01L 2224/80006; H01L 2224/81005; H01L 2224/83005
See application file for complete search history.

(56) References Cited

U.S. PATENT DOCUMENTS 8,283,754 B2 * 10/2012 Lin .................. H01L 21/32051
257/774
8,993,380 B2  3/2015 Hou et al.
(Continued)

*Primary Examiner* — David A Zarneke
(74) *Attorney, Agent, or Firm* — McClure, Qualey & Rodack, LLP

(57) ABSTRACT

A method for forming a semiconductor structure is provided. The method includes forming a contact feature over an insulating layer, forming a first passivation layer over the contact feature, and etching the first passivation layer to form a trench exposing the contact feature. The method also includes forming an oxide layer over the contact feature and the first passivation layer and in the trench, forming a first non-conductive structure over the oxide layer, and patterning the first non-conductive structure to form a gap. The method further includes filling a conductive material in the gap to form a first conductive feature. The first non-conductive structure and the first conductive feature form a first bonding structure. The method further includes attaching a carrier substrate to the first bonding structure via a second bonding structure over the carrier substrate.

20 Claims, 31 Drawing Sheets

(52) U.S. Cl.
CPC ............... *H01L 2224/05666* (2013.01); *H01L 2224/05684* (2013.01); *H01L 2224/08145* (2013.01); *H01L 2224/13006* (2013.01); *H01L 2224/80006* (2013.01); *H01L 2224/80379* (2013.01); *H01L 2224/808* (2013.01); *H01L 2224/81005* (2013.01); *H01L 2224/83005* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,081,440 B2 * | 8/2021 | Park .................... H01L 23/5384 |
| 11,393,764 B2 * | 7/2022 | Nam ...................... H01L 25/03 |

* cited by examiner

METHOD FOR FORMING SEMICONDUCTOR STRUCTURE

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion. The figures may be simplified for the sake of clarity to better understand different aspects of the disclosure.

DETAILED DESCRIPTION

Figure 1A:
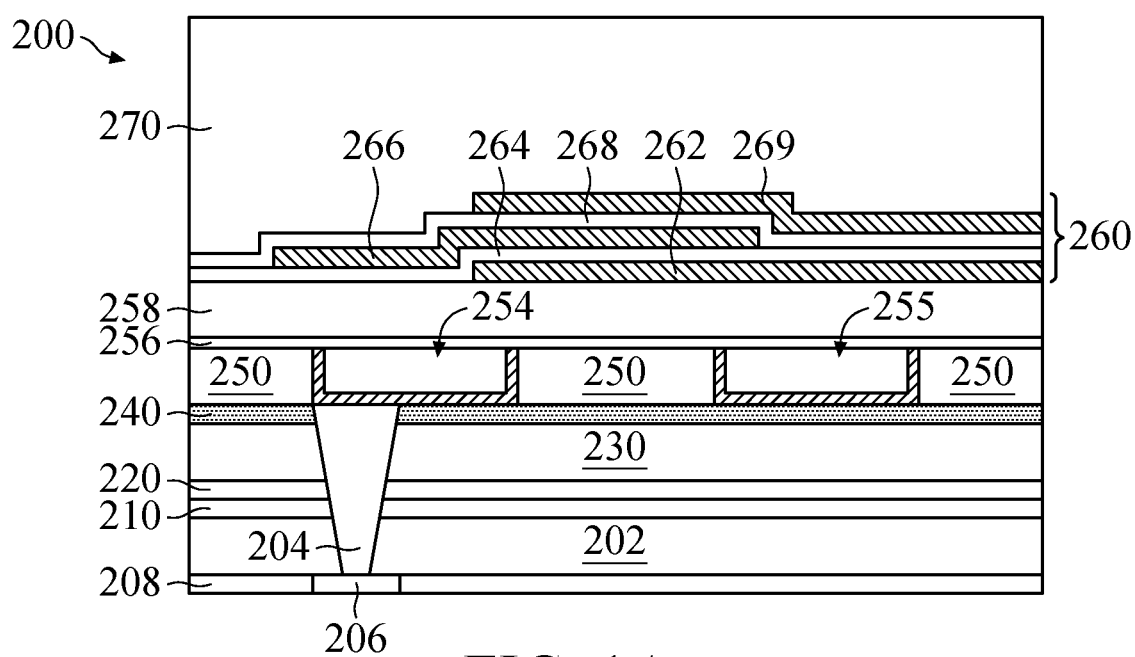
FIGS. 1A-1K are cross-sectional views illustrating various stages of forming a first semiconductor wafer, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The method for forming the semiconductor structure may include bonding a wafer and a carrier substrate via bonding structures formed thereon. The bonding structures may include a conductive material and a non-conductive material. Since the bonding structures may provide both covalent bonds and metallic bonds, the wafer and the carrier substrate may bond together in a more stable way, and the performance of the resulting semiconductor structure may be improved. Furthermore, the surface topography of the upper contact features is reduced during the formation of the bonding structures, thereby facilitating the following process.

FIGS. 1A-1K are cross-sectional views illustrating various stages of forming a first semiconductor wafer 200, in accordance with some embodiments of the disclosure. Additional features may be added in the first semiconductor wafer 200, and some of the features described below can be replaced, modified, or eliminated in other embodiments of the first semiconductor wafer 200.

As shown in FIG. 1A, the first semiconductor wafer 200 includes a substrate 202, in accordance with some embodiments. The substrate 202 may be a semiconductor substrate, such as a silicon substrate. The substrate 202 may include various layers formed thereon, including conductive or insulating layers. The substrate 202 may include various doping configurations depending on design requirements. The substrate 202 may also include other semiconductors, such as germanium, silicon carbide (SiC), silicon germanium (SiGe), or diamond. Alternatively, the substrate 202 may include a compound semiconductor and/or an alloy semiconductor. Further, in some embodiments, the substrate 202 may include an epitaxial layer (epi-layer), the substrate 202 may be strained for performance enhancement, the substrate 202 may include a silicon-on-insulator (SOI) structure, and/or the substrate 202 may have other suitable enhancement features.

In some embodiments, the substrate 202 includes one or more active and/or passive semiconductor devices such as transistors, diodes, optoelectronic devices, resistors, capacitors, sensors, or other devices. In various examples, the transistors may include source/drain features, gate structures, gate spacers, contact features, isolation structures, such as shallow trench isolation (STI) structures, or other suitable components. By way of example, the active and/or passive semiconductor devices formed within the substrate 202 may be formed as part of a front-end-of-line (FEOL) process.

In various examples, the substrate 202 may also include an interconnect structure, such as a multi-layer interconnect (MLI) structure, which may include multiple patterned dielectric layers and conductive layers that provide interconnections (e.g., wiring) between the various microelectronic components formed within the substrate 202. By way of example, the MLI structure, as well as other layers, features, components, or devices formed over the MLI structure may be formed as part of a back-end-of-line (BEOL) process.

In addition, one or more dielectric layers and/or conductive layers of the MLI structure may be formed over the substrate 202. As noted, the interconnect structure may include a plurality of conductive features and a plurality of dielectric features used to provide isolation between the conductive features. In some embodiments, the conductive features may include contacts, vias, or metal lines to provide horizontal and vertical interconnections. In some embodiments, the metal lines may include copper (Cu), aluminum (Al), aluminum copper (AlCu) alloy, ruthenium (Ru), cobalt (Co), or other appropriate metal layer. In some embodiments, the contacts and/or vias may include Cu, Al, AlCu alloy, Ru, Co, tungsten (W), or other appropriate metal layer. In some embodiments, the dielectric features of the MLI structure may include silicon oxide or a silicon oxide containing material where silicon exists in various suitable forms. In some embodiments, the dielectric features may include a low-k dielectric layer (e.g., having a dielectric constant less than that of $SiO_2$, which is about 3.9) such as tetraethylorthosilicate (TEOS) oxide, undoped silicate glass (USG), doped silicon oxide, such as borophosphosilicate glass (BPSG), fluorosilicate glass (FSG), phosphosilicate glass (PSG), boron doped silicon glass (BSG), and/or other suitable low-K dielectric material.

In some embodiments, a dielectric layer 210 is formed over the substrate 202. The dielectric layer 210 may include silicon oxide, a silicon oxide containing material, or a low-K dielectric layer, such as TEOS oxide, USG, doped silicon oxide, such as BPSG, FSG, PSG, BSG, and/or other suitable low-K dielectric material. In various examples, the dielectric layer 210 may be deposited by chemical vapor deposition (CVD), physical vapor deposition (PVD), atomic layer deposition (ALD), plasma enhanced CVD (PECVD), high-density plasma CVD (HDP-CVD), sub-atmospheric CVD (SACVD), or combinations thereof.

In some embodiments, a carbide layer 220 is formed over the dielectric layer 210. In some embodiments, the carbide layer 220 may include a silicon carbide (SiC) layer, although other types of carbide materials may be used. In some embodiments, the carbide layer 220 may be deposited by CVD, PVD, ALD, PECVD, HDP-CVD, SACVD, or combinations thereof. The carbide layer 220, in some embodiments, may be conformally deposited and have a substantially uniform thickness.

The first semiconductor wafer 200 may further include a dielectric layer 230 formed over the carbide layer 220. In some embodiments, the dielectric layer 230 may include silicon oxide or a silicon oxide containing material. In some embodiments, the dielectric layer 230 may include USG. In various examples, the dielectric layer 230 may be deposited by CVD, PVD, ALD, PECVD, HDP-CVD, SACVD, or combinations thereof. In some embodiments, the dielectric layer 230 may be conformally deposited and have a substantially uniform thickness.

In some embodiments, a dielectric layer 240 may be formed over the dielectric layer 230. In some embodiments, the dielectric layer 240 may include a nitrogen-containing material and/or a carbon-containing material. For example, the dielectric layer 240 may include silicon carbon nitride (SiCN), silicon oxycarbide (SiOC), silicon carbide (SiC), silicon oxycarbonitride (SiOCN), silicon nitride (SiN), or combinations thereof. In various examples, the dielectric layer 240 may be deposited by CVD, PVD, ALD, PECVD, HDP-CVD, SACVD, or combinations thereof. In some embodiments, the dielectric layer 240 may function as an etch stop layer (ESL).

A dielectric layer 250 may be deposited over the dielectric layer 240. In some embodiments, the dielectric layer 250 may include silicon oxide or a silicon oxide containing material. In some embodiments, the dielectric layer 250 may include USG. In various examples, the dielectric layer 230 may be deposited by CVD, PVD, ALD, PECVD, HDP-CVD, SACVD, or combinations thereof. In some embodiments, the dielectric layer 250 may be conformally deposited and have a substantially uniform thickness.

In some embodiments, a hard mask layer (not shown) may be deposited over the dielectric layer 250. In some embodiments, the hard mask layer may include a nitrogen-containing material and/or a carbon-containing material. For example, the hard mask layer may include SiOCN, SiCN, SiOC, SiC, SiN, or combinations thereof. In some embodiments, the hard mask layer may be conformally deposited and have a substantially uniform thickness. The hard mask layer may be patterned to form trenches. In various embodiments, a photolithography process (e.g., such as exposure and development) may be used to pattern the hard mask layer. An etching process may be performed using the hard mask layer to form the trenches in the dielectric layer 250. In some embodiments, a chemical mechanical planarization (CMP) process may be used to remove the hard mask layer to expose the underlying dielectric layer 250.

In some embodiments, lower contact features 254, 255 are formed in the trenches provided by the patterning of the dielectric layer 250. Although the lower contact features 254, 255 are disposed below upper contact features (e.g. upper contact features 284 and 285, which will be discussed below), the lower contact features 254, 255 are sometimes referred to as top metal (TM) contacts because they represent a top metal layer of the MLI structure, as previously discussed. In some embodiments, each of the lower contact features 254, 255 may include a barrier layer (not shown) and a metal fill layer (not shown). By way of example, formation of the lower contact features 254, 255 includes multiple processes. In some embodiments, the barrier layer is formed in each of the trenches provided by the patterning of the dielectric layer 250, followed by the deposition of a metal fill layer over the barrier layer. In some embodiments, the barrier layer includes titanium nitride, tantalum, tantalum nitride, or combinations thereof. In some embodiments, the metal fill layer includes a metal or metal alloy such as Cu, Co, Ni, Al, W, Ti, or combinations thereof. In some embodiments, the metal fill layer is formed by deposition or plating. In some embodiments, a CMP process removes portions of the metal fill layer and the barrier layer disposed over the top surface of the dielectric layer 250, so that remaining portions of the metal fill layer and the barrier layer fill the trenches provided by the patterning of the dielectric layer 250 and provide the lower contact features 254, 255.

A dielectric layer 256 may be formed over the lower contact features 254, 255. The dielectric layer 256 may include a nitrogen-containing material and/or a carbon-containing material. For example, the dielectric layer 256 may include SiCN, SiOC, SiC, SiOCN, SiN, or combinations thereof. In various examples, the dielectric layer 256 may be deposited by CVD, PVD, ALD, PECVD, HDP-CVD, SACVD, or combinations thereof. In some embodiments, the dielectric layer 256 may protect the lower contact features 254, 255 from being oxidized.

A dielectric layer 258 may be formed over the dielectric layer 256. In some embodiments, the dielectric layer 258 may include silicon oxide or a silicon oxide containing material. In some embodiments, the dielectric layer 258 may include USG. The dielectric layer 258 may be deposited by CVD, PVD, ALD, PECVD, HDP-CVD, SACVD, or combinations thereof.

A metal-insulator-metal (MIM) structure 260 is then formed over the dielectric layer 258. Fabrication of the MIM structure 260 may involve multiple processes such as deposition and patterning of a bottom conductor plate layer, a middle conductor plate layer, and a top conductor plate layer, as well as formation of insulators between adjacent conductor plate layers of the MIM capacitor. For example, in the embodiments shown in FIG. 1A, the MIM structure 260 includes multiple metal layers including a bottom conductor plate layer 262, a middle conductor plate layer 266, and a top conductor plate layer 269, which function as metal plates of capacitors. The MIM structure 260 also includes multiple insulator layers including an insulator layer 264 disposed between the bottom conductor plate layer 262 and the middle conductor plate layer 266, as well as an insulator layer 268 disposed between the middle conductor plate layer 266 and the top conductor plate layer 269. By way of example, the MIM structure 260 may be used to implement one or more capacitors, which may be connected to other microelectronic components (e.g., including active and/or passive devices, described above). In addition, and in some embodiments, the multi-layer MIM structure 260 allows capacitors to be closely packed together in both vertical and lateral directions, thereby reducing an amount of lateral space needed for implementing capacitors. As a result, the MIM structure 260 may accommodate super high-density capacitors.

In some embodiments, to increase capacitance values, the insulator layer 264 and/or the insulator layer 268 may include high-k dielectric material(s) having a dielectric constant (k-value) larger than that of silicon oxide. In various examples, the insulator layers 264, 268 may be relatively thin to further provide increased capacitance values, while maintaining sufficient thicknesses to avoid potential dielectric breakdown of the capacitors in the MIM structure 260 (e.g., when two capacitor plates have high potential difference, current may leak between the plates, causing breakdown).

An insulating layer 270 may be formed over the MIM structure 260. The insulating layer 270 may include silicon oxide or a silicon oxide containing material. In some embodiments, the insulating layer 270 may include USG. The insulating layer 270 may be deposited by CVD, PVD, ALD, PECVD, HDP-CVD, SACVD, or combinations thereof. While the insulating layer 270 may have a uniform top surface, the thickness of insulating layer 270 may vary depending on the thickness of MIM structure 260 and/or the bottom conductor plate layer 262, the middle conductor plate layer 266, and the top conductor plate layer 269.

In some embodiments, a through-substrate via (TSV) 204 may be formed in the dielectric layer 240, the dielectric layer 230, the carbide layer 220, the dielectric layer 210, and the substrate 202 to provide electrical connections between the first semiconductor wafer 200 and a second semiconductor wafer (not shown). The TSV 204 may be in direct contact with a conductive feature 206 in a bonding structure 208 (Details about the second semiconductor wafer, the conductive feature 206, and the bonding structure 208 will be discussed below.) Although FIG. 1A shows only one TSV, the number of TSV may be adjusted according to actual application.

Figure 1B:
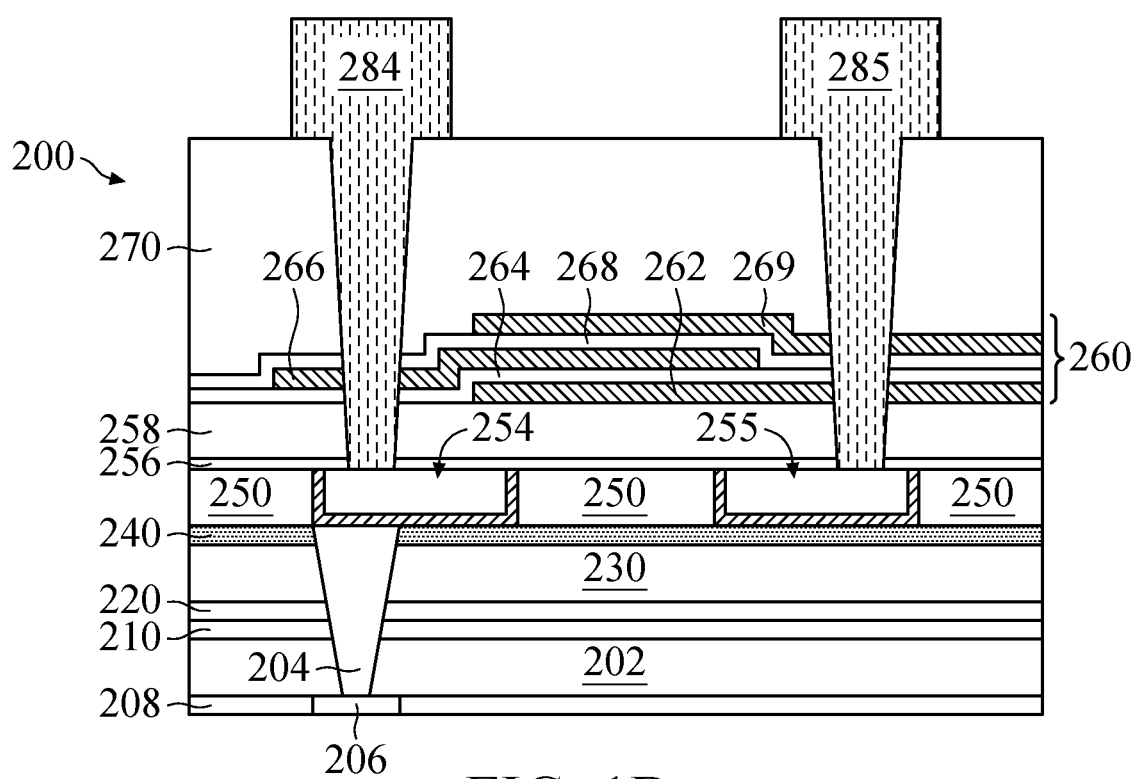

Afterwards, upper contact features 284, 285 are formed, as shown in FIG. 1B in accordance with some embodiments. More specifically, openings (not shown) may be formed to penetrate through the insulating layer 270, a portion of the MIM structure 260, the dielectric layer 258, and the dielectric layer 256 to expose the top surfaces of the lower contact features 254, 255. In some embodiments, the openings may be formed using a suitable combination of photolithography processes (e.g., such as photoresist deposition, exposure, and development) and an etching process (e.g., such as a dry etching process, a wet etching process, or a combination thereof).

The upper contact features 284, 285 may be formed in and over each of the openings, respectively. Each of the upper contact features 284, 285 may include a barrier layer and a metal fill layer. In some embodiments, the barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, metal fill layer includes tungsten, ruthenium, cobalt, copper, aluminum, iridium, palladium, platinum, nickel, low resistivity metal constituent, alloys thereof, or combinations thereof.

In some embodiments, to form the upper contact features 284, 285, the barrier layer is first conformally deposited in the openings using a suitable deposition technique, such as CVD, PVD, ALD, PECVD, HDP-CVD, SACVD, or combinations thereof, and then the metal fill layer is deposited over the barrier layer using a suitable deposition technique, such as CVD, PVD, ALD, PECVD, HDP-CVD, SACVD, or combinations thereof. The deposited barrier layer and the metal fill layer are then patterned to form the upper contact features 284, 285. In some embodiments, the barrier layer and the metal fill layer are patterned in a two-stage or multiple-stage etch process.

The upper contact features 284, 285 include metal that fill the openings and may be referred to as contact vias, metal vias, or metal lines. In some embodiments, the upper contact features 284, 285 may be referred to as contact pads. In some embodiments, portions of the upper contact features 284, 285 above the insulating layer 270 have substantially straight sidewalls. However, in some alternative embodiments, portions of the upper contact features 284, 285 above the insulating layer 270 have tapered sidewalls.

In some embodiments, an upper portion of the upper contact features 284, 285 are part of a redistribution layer (RDL) that includes various metal lines used to redistribute bonding pads to different locations, such as from peripheral locations to being uniformly distributed on chip surface. In various examples, the RDL couples the MLI structure to the bonding pads, for connection to external circuitry. The upper contact features 284, 285 provide electrical contact to the lower contact features 254, 255, respectively. In addition, the upper contact feature 284 is electrically coupled to the middle conductor plate layer 266, while being electrically isolated from the bottom conductor plate layer 262 and the top conductor plate layer 269. Further, the upper contact feature 285 is electrically coupled to the bottom conductor plate layer 262 and the top conductor plate layer 269, while being electrically isolated from the middle conductor plate layer 266. Thus, the upper contact feature 284 provides electrical contact to a first terminal of the MIM structure 260, and the upper contact feature 285 provides electrical contact to a second terminal of the MIM structure 260.

Figure 1C:
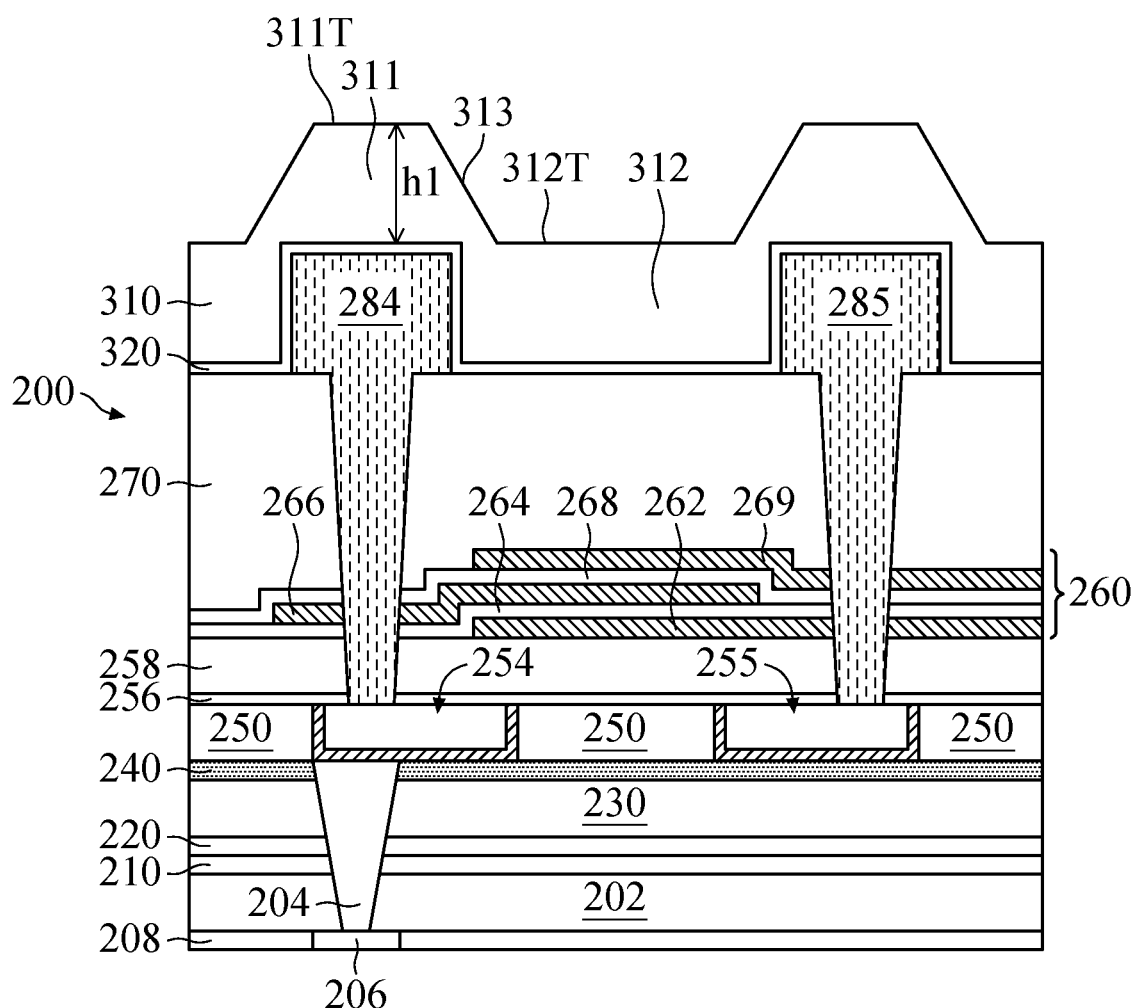

Next, a first passivation layer 310 is formed over the insulating layer 270 and the upper contact features 284, 285, as shown in FIG. 1C in accordance with some embodiments. The first passivation layer 310 may include silicon oxide or a silicon oxide containing material. In some embodiments, the first passivation layer 310 may include USG. The first passivation layer 310 may be deposited by CVD, PVD, ALD, PECVD, HDP-CVD, SACVD, or combinations thereof.

The first passivation layer 310 includes a first portion 311 over the upper conductive features 284, 285 and a second portion 312 over the insulating layer 270. The first portion 311 has a first top surface 311T, the second portion 312 has a second top surface 312T, and a tapered sidewall 313 connects the first top surface 311T of the first portion 311 and the second top surface 312T of the second portion 312. The first top surface 311T of the first portion 311 is higher than the second top surface 312T of the second portion 312.

In some embodiments, before the first passivation layer 310 is formed, a second passivation layer 320 may be formed over the upper contact features 284, 285. The second passivation layer 320 may include silicon oxide or a silicon oxide containing material. The second passivation layer 320 may be deposited by CVD, PVD, ALD, PECVD, HDP-CVD, SACVD, or combinations thereof. The shape of the second passivation layer 320 may correspond to the shape of the upper contact features 284, 285. In some embodiments, the second passivation layer 320 may include a two-layer structure. In some embodiments, the thickness of the first passivation layer 310 is greater than the thickness of the second passivation layer 320. In some embodiments, the first passivation layer 310 and the second passivation layer 320 are made of different materials. In some embodiments, the first passivation layer 310 and the second passivation layer 320 are made of the same material.

Figure 1D:
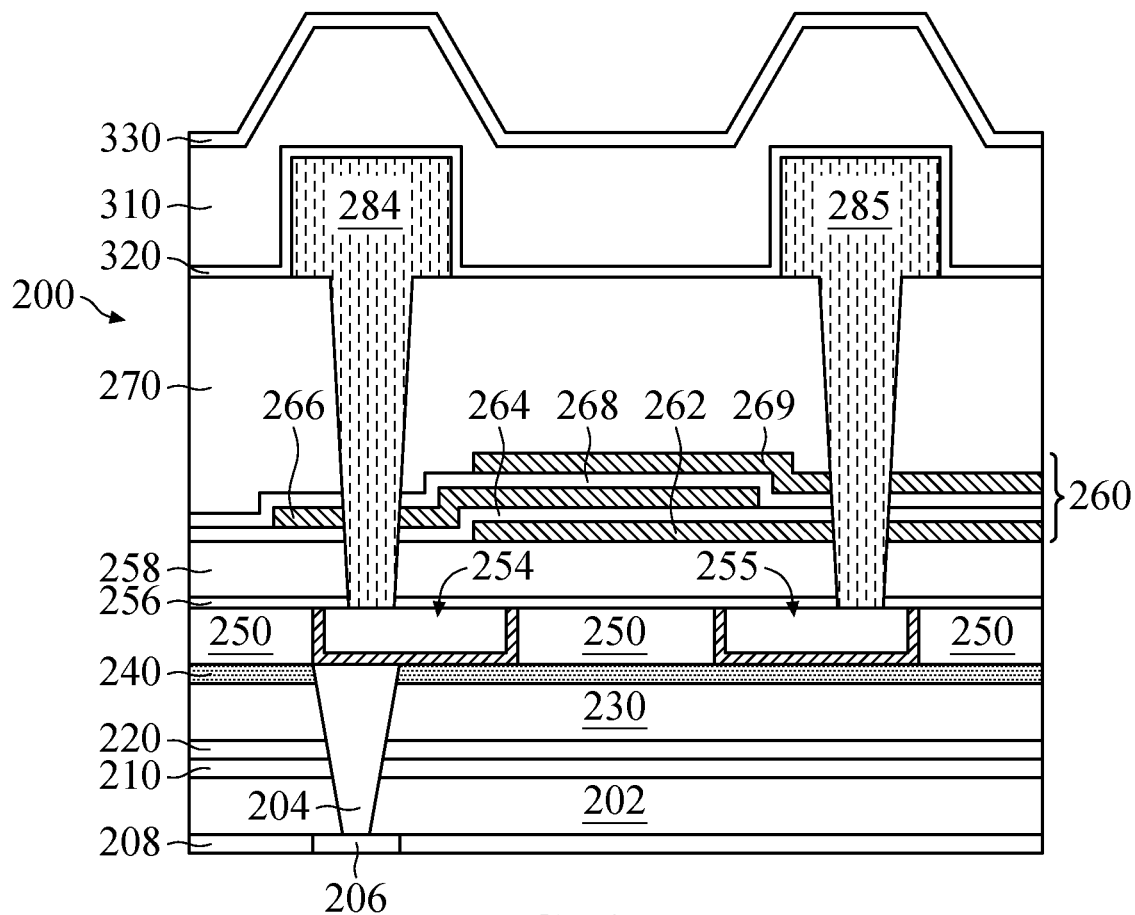

Afterwards, a third passivation layer 330 is formed over the first passivation layer 310, as shown in FIG. 1D in accordance with some embodiments. The third passivation may include a nitrogen-containing material and/or a carbon-containing material. For example, the third passivation layer 330 may include SiCN, SiOC, SiC, SiOCN, SiN, or combinations thereof. In some embodiments, the first passivation layer 310 and the third passivation layer 330 include different materials. Due to the first passivation layer 310, the second passivation layer 320, and/or the third passivation layer 330, the surface topography of the upper contact features 284, 285 is reduced, thereby facilitating the following process.

Figure 1E:
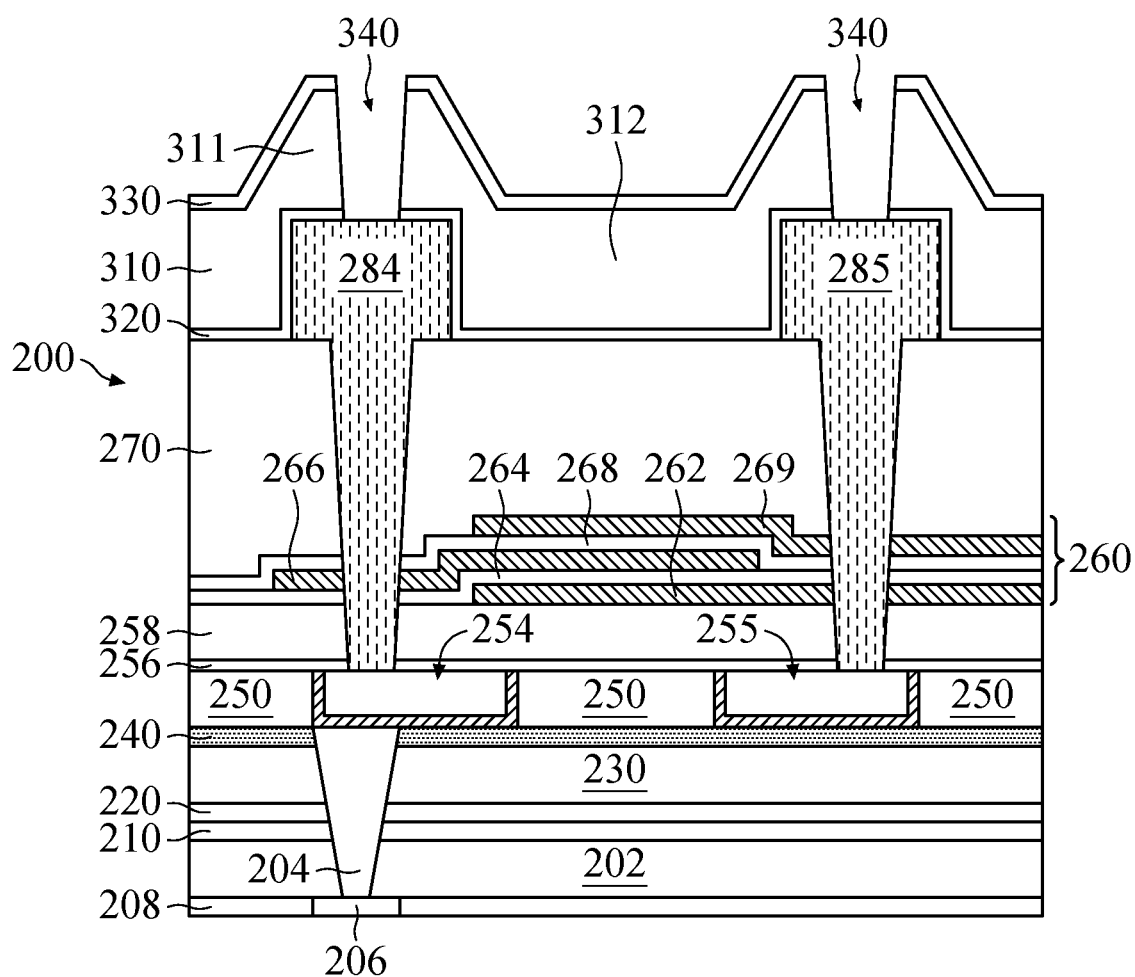

Afterwards, the third passivation layer 330, the first passivation layer 310, and the second passivation layer 320 are etched to form a trench 340 that exposes the top surfaces the upper contact features 284, 285, as shown in FIG. 1E in accordance with some embodiments. In some embodiments, for the first passivation layer 310, only the first portion 311 is partially removed to form the trench 340, and the second portion 312 remains the same.

Figure 1F:
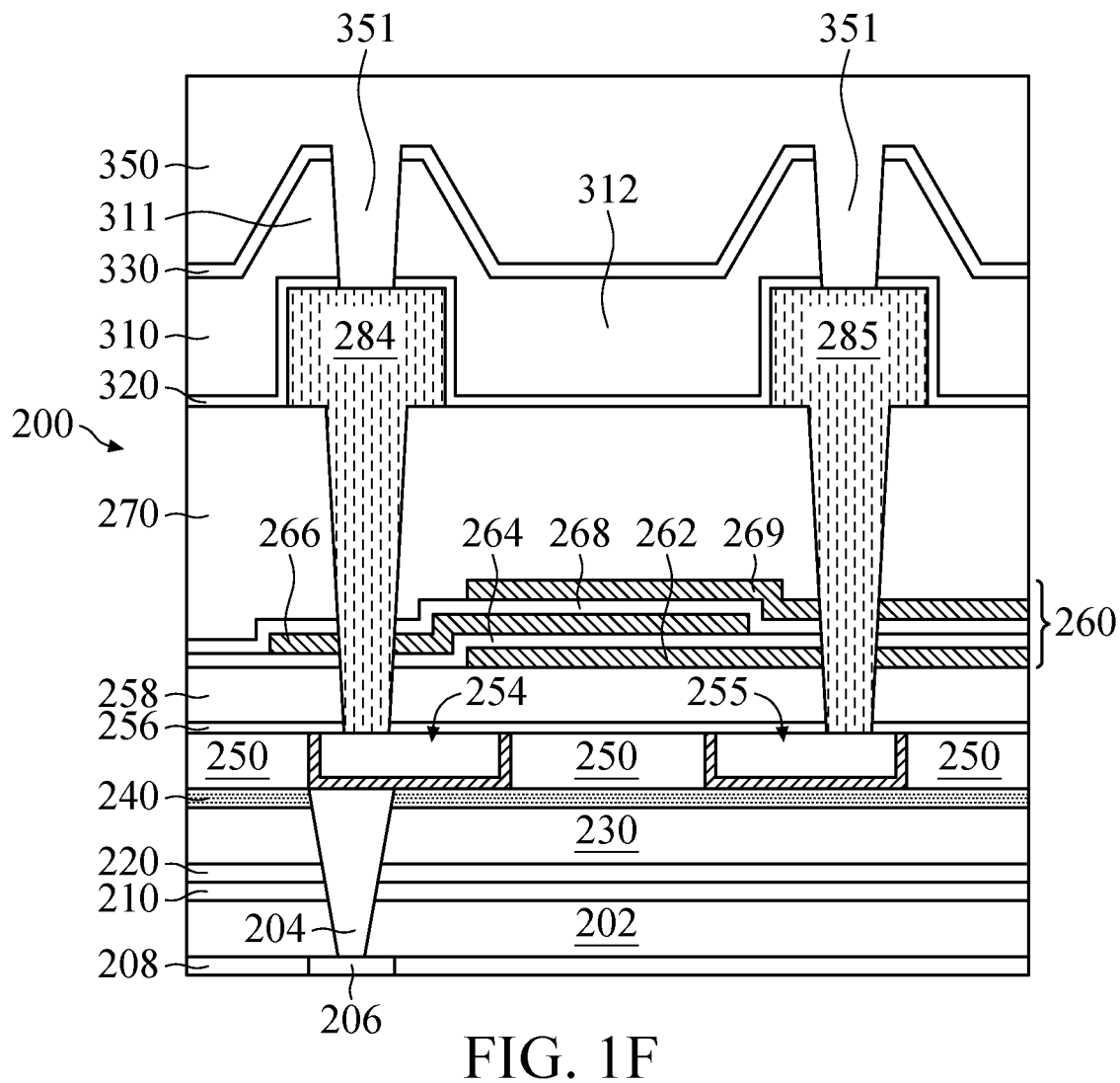

Afterwards, an oxide layer 350 is formed over the third passivation layer 330, the first passivation layer 310, the second passivation layer 320, the upper contact features 284, 285, and in the trench 340, as shown in FIG. 1F in accordance with some embodiments. In other words, the oxide layer 350 may be formed to cover both the first portion 311 and the second portion 312 of the first passivation layer 310 and extend into the trench 340. Or, it may be viewed as the oxide layer 350 includes an extending portion 351 extending through the first portion 311 of the first passivation layer 310. The extending portion 351 may be trapezoidal. That is, a part of a profile of the oxide layer 350 is trapezoidal. The oxide layer 350 may include silicon oxide or a silicon oxide containing material. In some embodiments, the oxide layer 350 may include USG. The oxide layer 350 may be deposited by CVD, PVD, ALD, PECVD, HDP-CVD, SACVD, or combinations thereof.

In some embodiments, an annealing process may be performed on the first passivation layer 310 before the oxide layer 350 is formed. In some embodiments, a high performance anneal may be added during the annealing process. Due to the annealing process, some part of the first passivation layer 310 may re-crystallize, and the performance of the first semiconductor wafer 200 may be improved.

Figure 1G:
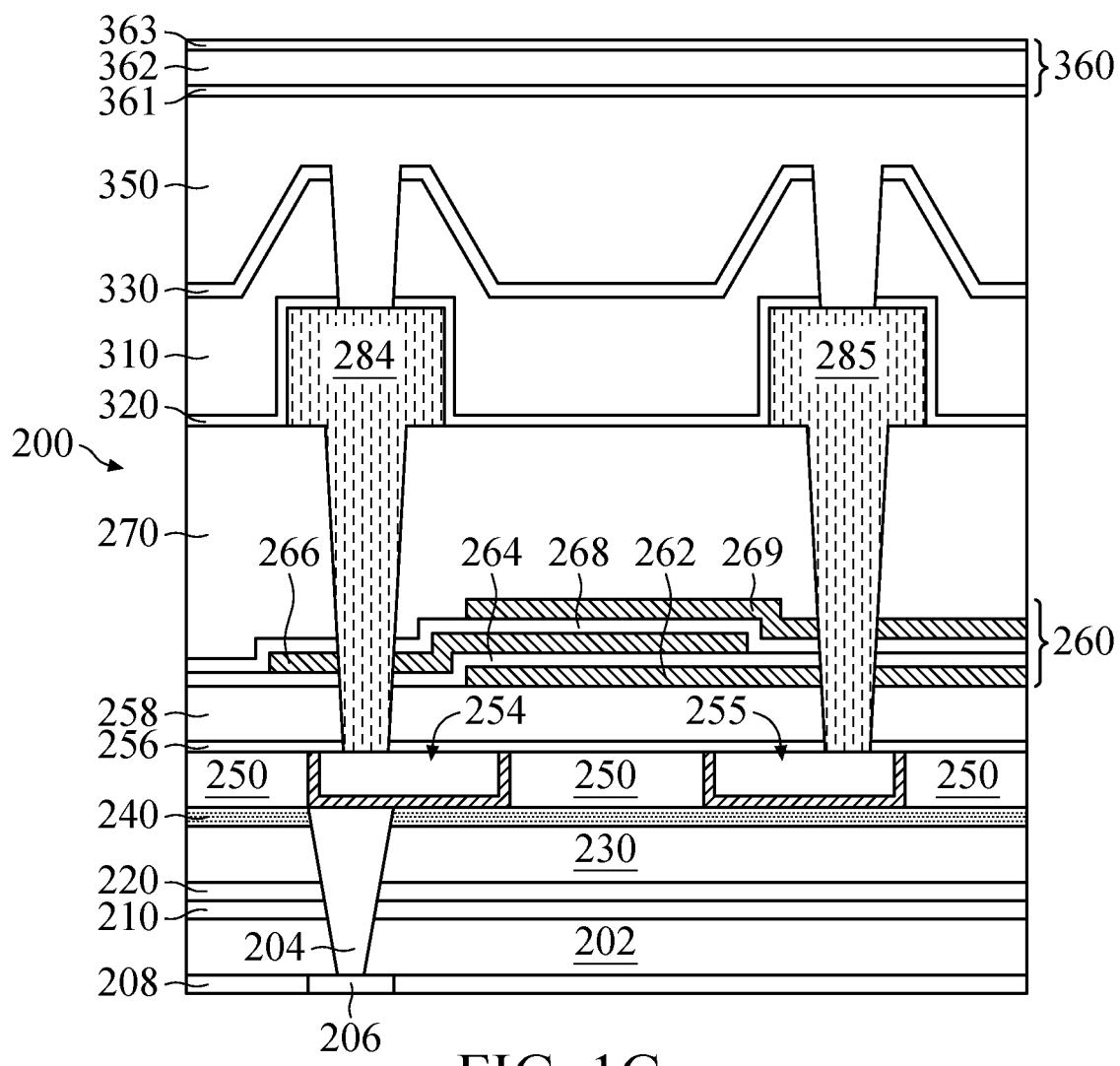

Afterwards, a first non-conductive structure 360 is formed over the oxide layer 350, as shown in FIG. 1G in accordance with some embodiments. The first non-conductive structure 360 may include silicon oxide, a silicon oxide containing material, a nitrogen-containing material, and/or a carbon-containing material. In some embodiments, the first non-conductive structure 360 may be a multi-layer structure. For example, the first non-conductive structure 360 may be a tri-layer structure including a first layer 361, a second layer 362, and a third layer 363. In some embodiments, the first layer 361 and the second layer 362 may include different materials.

Figure 1H:
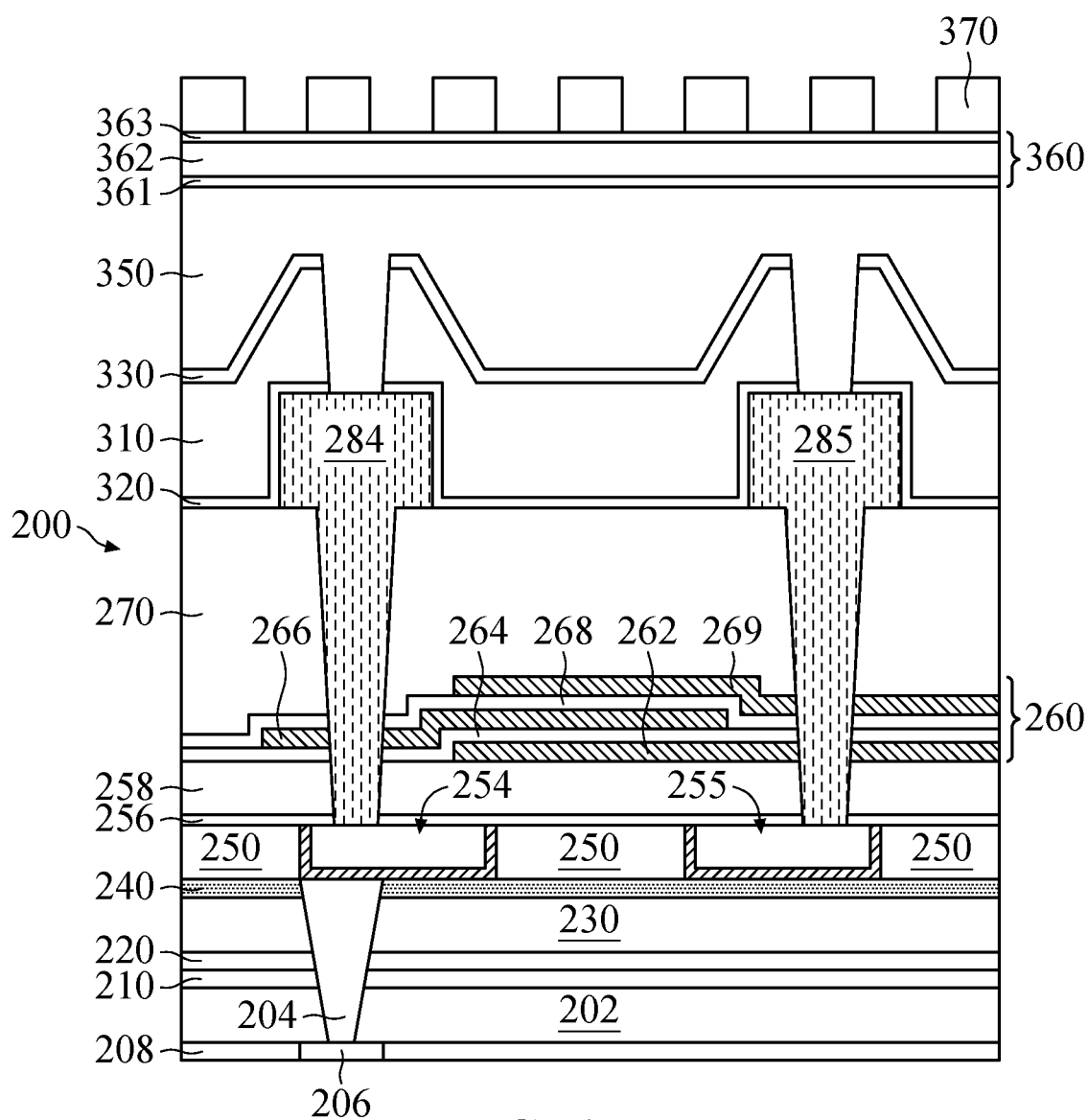

After the first non-conductive structure 360 is formed, a patterned etch mask layer 370 is formed over the first non-conductive structure 360, as shown in FIG. 1H in accordance with some embodiments. For example, a suitable combination of photolithography processes (such as photoresist deposition, exposure, and development) may be used to pattern an etch mask layer to form the patterned etch mask layer 370.

Figure 1I:
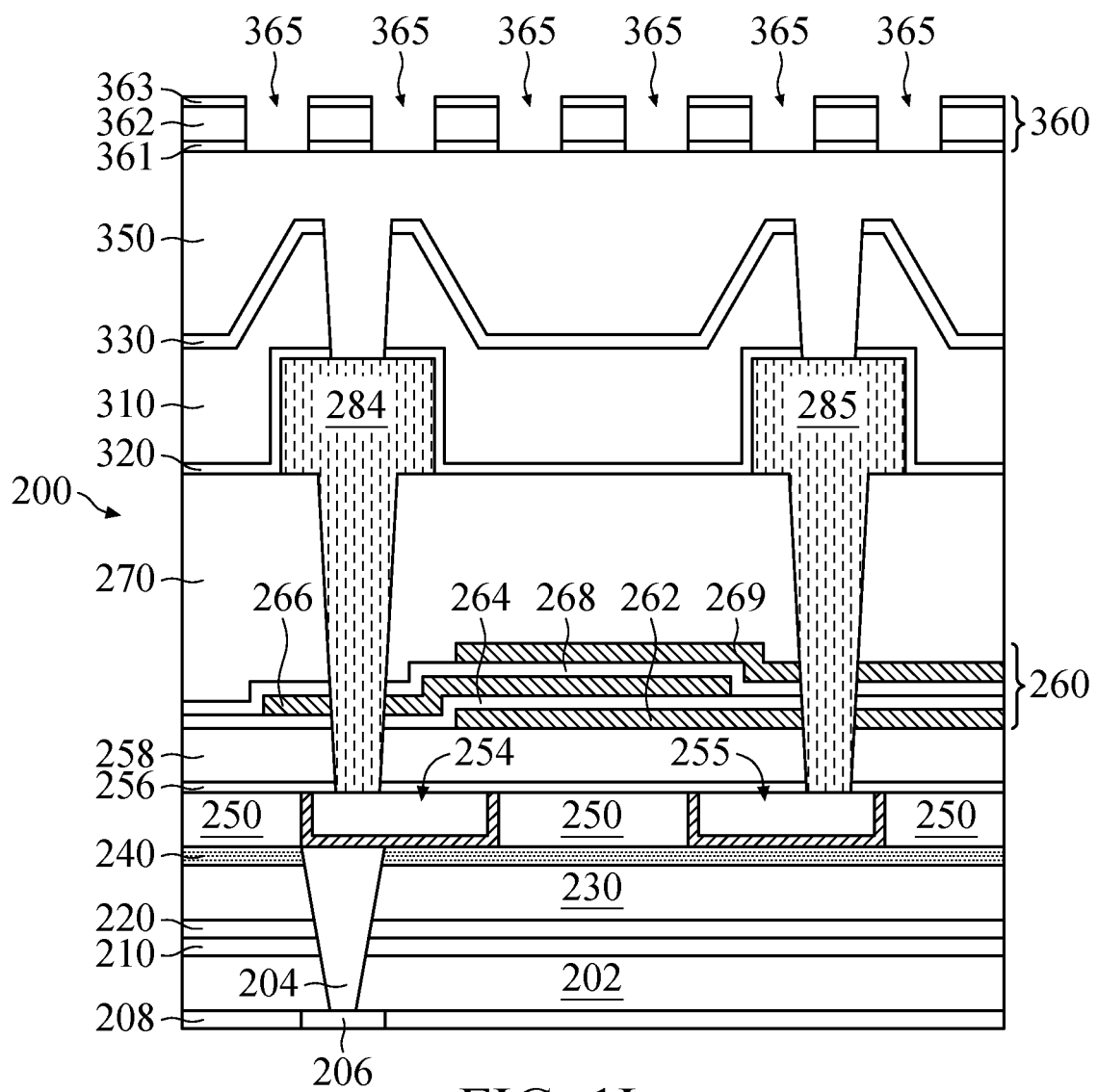

Next, an etching process is performed using the patterned etch mask layer 370 as the mask to form the gaps 365 in the first non-conductive structure 360, as shown in FIG. 1I in accordance with some embodiments. After the gaps 365 are formed, the patterned etch mask layer 370 is removed in accordance with some embodiments.

Figure 1J:
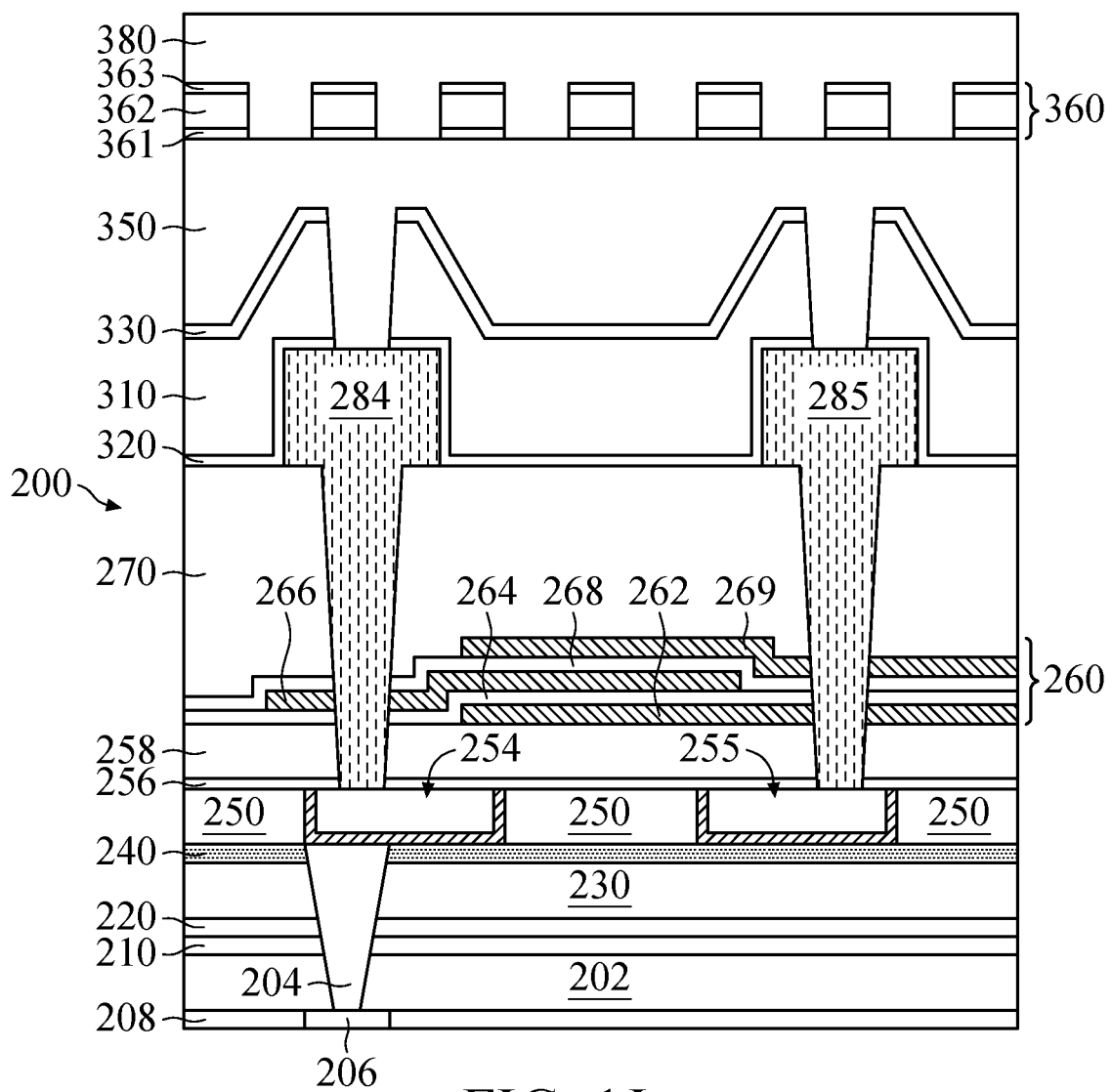

A conductive material 380 is formed over the first non-conductive structure 360 and in the gaps 365, as shown in FIG. 1J in accordance with some embodiments. The conductive material 380 may include Cu, Co, Ni, Al, W, Ti, or combinations thereof. In some embodiments, the conductive material 380 is formed by plating.

Figure 1K:
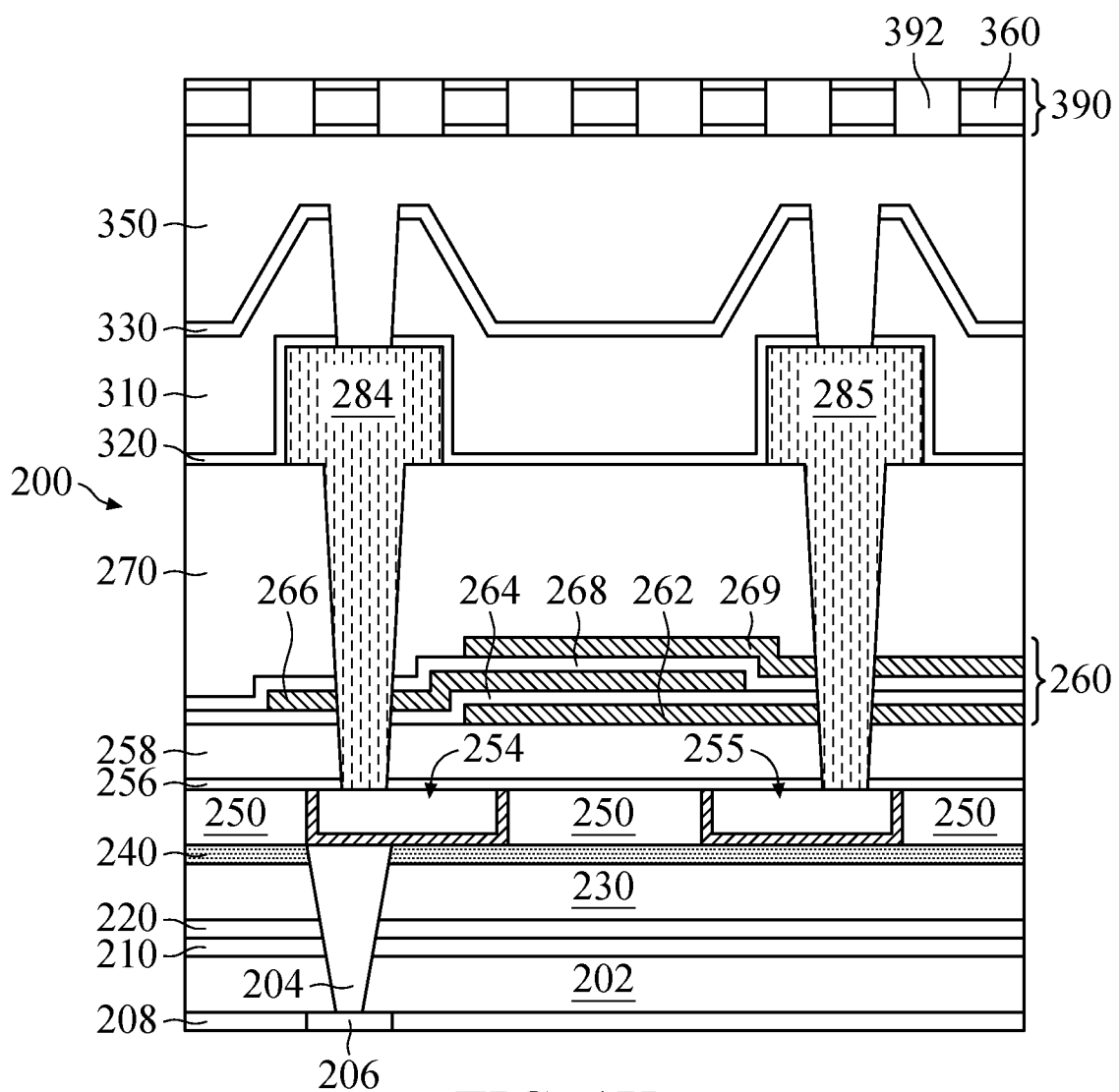

Then, a planarization process (such as using a CMP process) may be used to remove part of the conductive material 380 until the conductive material 380 is substantially level with the top surface of the first non-conductive structure 360, as shown in FIG. 1K in accordance with some embodiments. The conductive material 380 embedded in the first non-conductive structure 360 may be referred to as a first conductive feature 392. The first non-conductive structure 360 and the first conductive feature 392 together form a first bonding structure 390. That is, the first bonding structure 390 includes not only non-conductive material but also conductive material. It should be noted that, the upper contact features 284, 285 and the first conductive feature 392 are electrically isolated.

FIGS. 2A-2E are cross-sectional views illustrating various stages of forming a first carrier substrate 600 and a second bonding structure 650 (denoted in FIG. 2E) thereon, in accordance with some embodiments of the disclosure. The first carrier substrate 600 may be used to provide temporary mechanical and structural support for the build-up layers or structures. The first carrier substrate 600 may be a glass substrate, semiconductor substrate, or another suitable substrate. The first carrier substrate 600 and the second bonding structure 650 may be removed in the subsequent processes. Details will be discussed below.

Figure 2A:
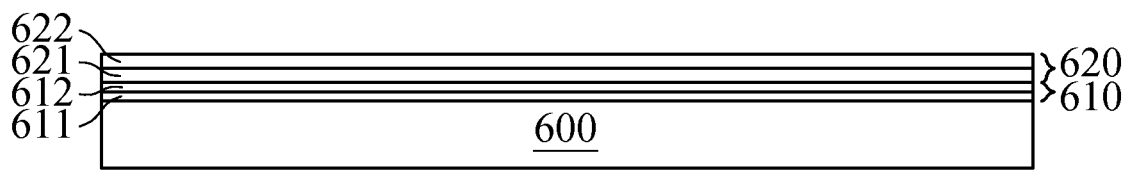
FIGS. 2A-2E are cross-sectional views illustrating various stages of forming a first carrier substrate and a second bonding structure thereon, in accordance with some embodiments of the disclosure.

A bottom structure 610 may be deposited over the first carrier substrate 600, and a second non-conductive structure 620 may be deposited over the bottom structure 620, as shown in FIG. 2A in accordance with some embodiments. The bottom structure 610 and the second non-conductive structure 620 may include silicon oxide, a silicon oxide containing material, a nitrogen-containing material, and/or a carbon-containing material. In some embodiments, at least one of the bottom structure 610 and the second non-conductive structure 620 include more than one layer. In some embodiments, the number of layers of the bottom structure 610 is identical to the number of layers of the second non-conductive structure 620. For example, the bottom structure 610 may include two layers 611, 612, and the second non-conductive structure 620 may also include two layers 621, 622.

Figure 2B:
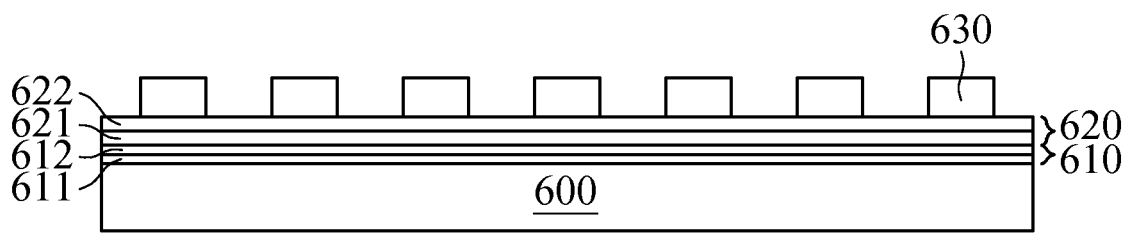

After the second non-conductive structure 620 is formed, a patterned etch mask layer 630 is formed over the second non-conductive structure 620, as shown in FIG. 2B in accordance with some embodiments. For example, a suitable combination of photolithography processes (such as photoresist deposition, exposure, and development) may be used to pattern an etch mask layer to form the patterned etch mask layer 630.

Figure 2C:
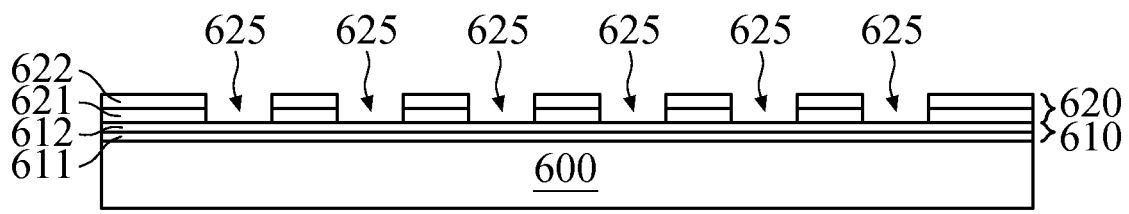

Next, an etching process may be performed using the etch mask layer 630 as the mask to form openings 625 in the second non-conductive structure 620, as shown in FIG. 2C in accordance with some embodiments. The second non-conductive structure 620 may be patterned to form the openings 625, and the bottom structure 610 is exposed by the openings 625. After the openings 625 are formed, the patterned etch mask layer 360 is removed in accordance with some embodiments.

Figure 2D:
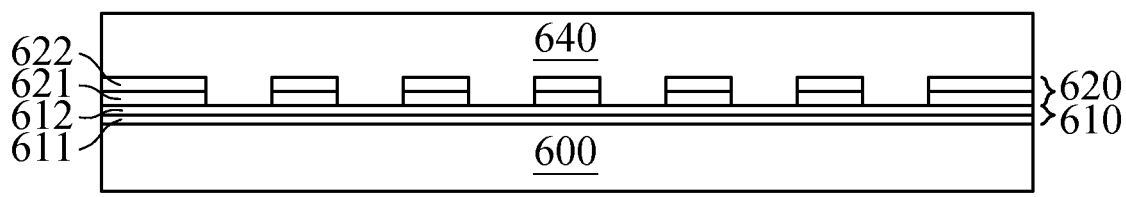

Afterwards, a conductive material 640 is formed over the second non-conductive structure 620 and in the openings 625, as shown in FIG. 2D in accordance with some embodiments. The conductive material 640 may include Cu, Co, Ni, Al, W, Ti, or combinations thereof. In some embodiments, the conductive material 640 and the conductive material 380 include the same material. In some embodiments, the conductive material 640 is formed by plating.

Figure 2E:
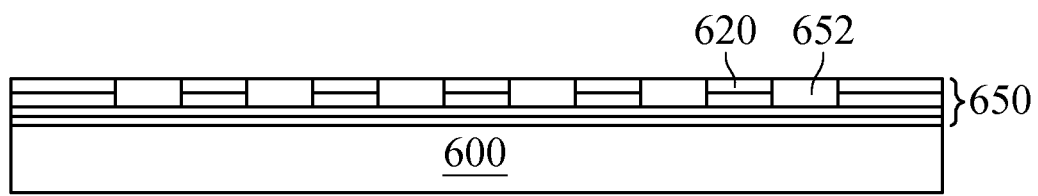

Then, a planarization process (such as using a CMP process) may be used to remove part of the conductive material 640 until the conductive material 640 is substantially level with the top surface of the second non-conductive structure 620, as shown in FIG. 2E in accordance with some embodiments. The conductive material 640 embedded in the second non-conductive structure 620 may be referred to as a second conductive feature 652. The second non-conductive structure 620 and the second conductive feature 652 together form a second bonding structure 650. That is, the second bonding structure 650 includes not only non-conductive material but also conductive material.

Figure 3:
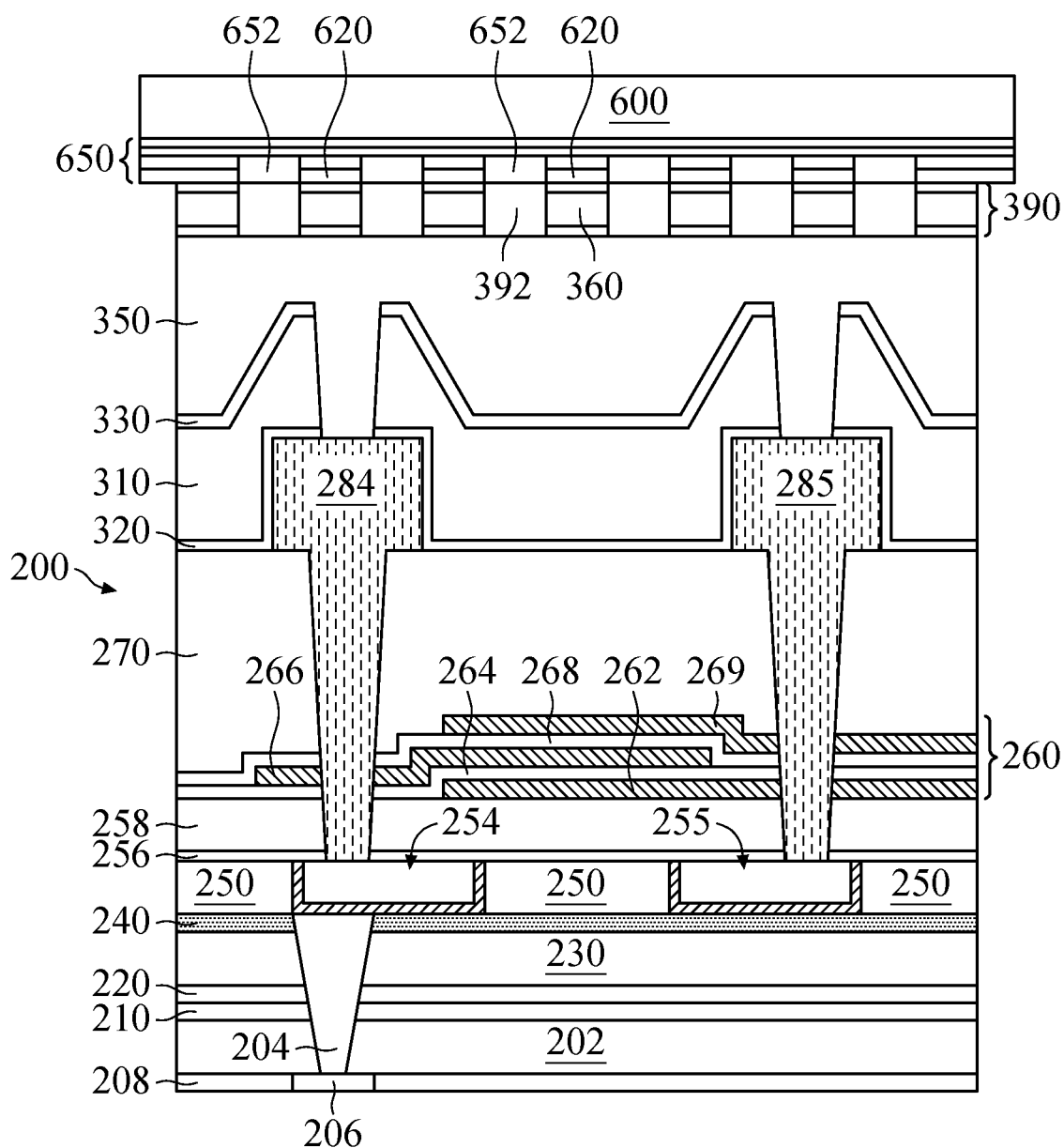
FIG. 3 is a cross-sectional view illustrating the first semiconductor wafer attached to the first carrier substrate, in accordance with some embodiments of the disclosure.

FIG. 3 is a cross-sectional view illustrating the first semiconductor wafer 200 attached to the first carrier substrate 600, in accordance with some embodiments of the disclosure. The first semiconductor wafer 200 may be attached to the first carrier substrate 600 via the first bonding structure 390 over the first semiconductor wafer 200 and the second bonding structure 650 over the first carrier substrate 600. In other words, the first carrier substrate 600 may be attached to the first bonding structure 390. In some embodiments, the first conductive feature 392 is in direct contact with the second conductive feature 652, and/or the first non-conductive structure 360 is in direct contact with the second non-conductive structure 620. In some embodiments, the first conductive feature 392 is aligned with the second conductive feature 652, and/or the first non-conductive structure 360 is aligned with the second non-conductive structure 620.

Figure 4A:
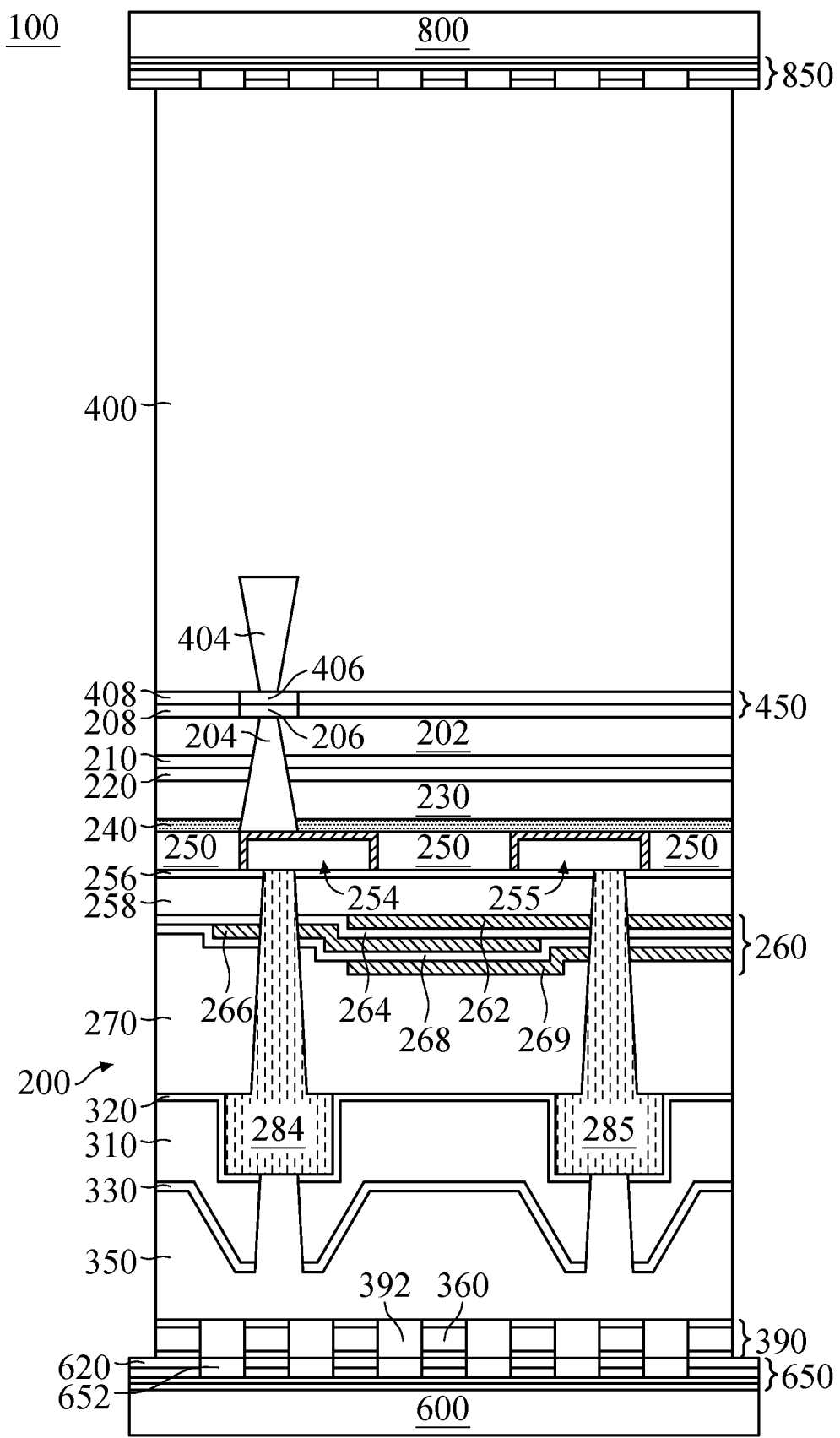
FIG. 4A is a cross-sectional view illustrating a semiconductor device, in accordance with some embodiments of the disclosure.

FIG. 4A is a cross-sectional view illustrating a semiconductor device 100, in accordance with some embodiments of the disclosure. The semiconductor device 100 includes the first semiconductor wafer 200, a second semiconductor wafer 400, the first carrier substrate 600, and a second carrier substrate 800.

The first semiconductor wafer 200 and the first carrier substrate 600 are electrically isolated, the second semiconductor wafer 400 and the second carrier substrate 800 are electrically isolated, and the first semiconductor wafer 200 and the second semiconductor wafer 400 are electrically connected. For example, the TSV 204 in the first semiconductor wafer 200 may be electrically connected to a metallization structure 404 in a bonding structure 408. It should be noted that, for the sake of clear illustration, the second semiconductor wafer 400 and the metallization structure 404 are schematically illustrated. The second semiconductor wafer 400 may include a substrate and various layers including conductive or insulating layers, but is not limited thereto. Also, the metallization structure 404 may include other configurations of interconnect structures, such as TSVs, contact plugs, conductive lines, and/or conductive features, but is not limited thereto.

As described above, the first semiconductor wafer 200 may be attached to the first carrier substrate 600 via the first bonding structure 390 over the first semiconductor wafer 200 and the second bonding structure 650 over the first carrier substrate 600. Similarly, the second semiconductor wafer 400 may be attached to the second carrier substrate 800 via a third bonding structure 850, and the first semiconductor wafer 200 may be bonded to the second semiconductor wafer 400 via a fourth bonding structure 450. (The bonding structure 208 of the first semiconductor wafer 200 and the bonding structure 408 of the second semiconductor wafer 400 form the fourth bonding structure 450.) The third bonding structure 850 and the fourth bonding structure 450 may be similar to the first bonding structure 390 and/or the second bonding structure 650. That is, the first bonding structure 390, the second bonding structure 650, the third bonding structure 850, and the fourth bonding structure 450 may all include a conductive feature embedded in a non-conductive structure. In some embodiments, the first semiconductor wafer 200 is attached to the first carrier substrate 600 via the second bonding structure 650 over the first carrier substrate 600 at a temperature in a range from about 300° C. to about 600° C. In some embodiments, the first semiconductor wafer 200 is attached to the first carrier substrate 600 via the second bonding structure 650 over the first carrier substrate 600 at a temperature in a range from about 400° C. to about 550° C.

Figure 4B:
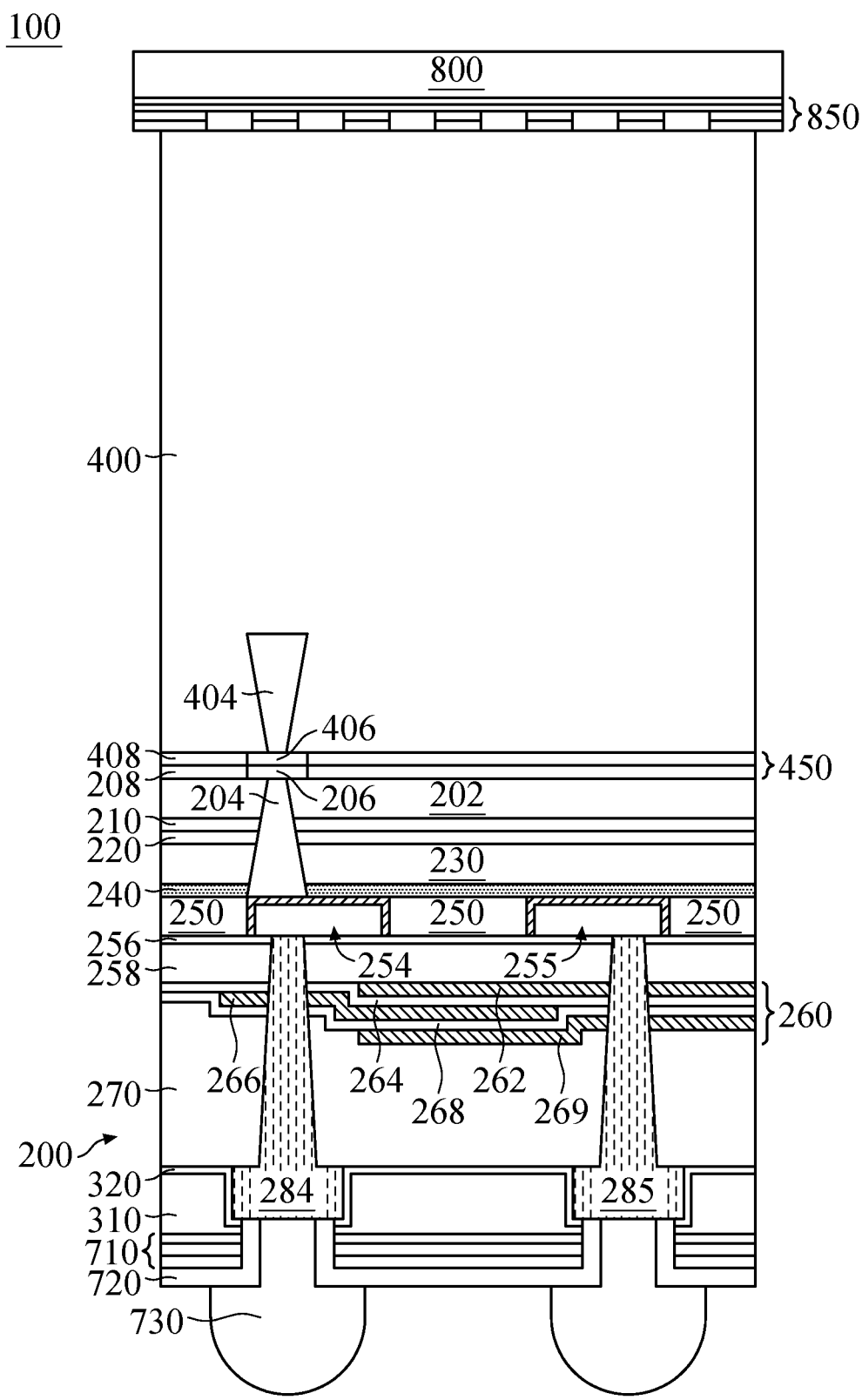
FIG. 4B is a cross-sectional view illustrating removing the first carrier substrate of the semiconductor device in FIG. 4A, in accordance with some embodiments of the disclosure.

FIG. 4B is a cross-sectional view illustrating removing the first carrier substrate 600 of the semiconductor device 100 in FIG. 4A, in accordance with some embodiments of the disclosure. The first carrier substrate 600, the second bonding structure 650, and the first bonding structure 390 may be polished (such as using a CMP process) until the first passivation layer 310 of the first semiconductor wafer 200 is exposed. Then, a post passivation layer 710 may be formed over the oxide layer 350. The post passivation layer 710 may be etched to form a post trench (not shown) exposing the upper contact features 284, 285. A polymeric layer 720 may be formed over the post passivation layer 710 and on the sidewalls of the post trench. The polymeric layer 720 may include polyimide (PI). The polymeric layer 720 may be conformally deposited over the post passivation layer 710 first and into the post trench using a suitable deposition technique, such as spin-coating. In some embodiments, a baking process may be performed after deposition of the polymeric layer 720. The deposited polymeric layer 720 may then be patterned using a suitable combination of photolithography processes (e.g., such as photoresist deposition, exposure, and development) to form an etch mask, and an etching process may be performed using the etch mask to form the post trench that expose top surfaces of the upper contact features 284, 285, respectively. A conductive bump 730 may be formed in the post trench. The conductive bump 730 may include conductive materials with low resistivity, such as solder or solder alloy. Exemplary elements included in the solder alloy include Sn, Pb, Ag, Cu, Ni, Bi or combinations thereof.

FIGS. 5A-5I are cross-sectional views illustrating various stages of forming another first semiconductor wafer 200A, in accordance with some embodiments of the disclosure. FIG. 5J is a cross-sectional view illustrating the first semiconductor wafer 200A of FIG. 5I that is attached to the first carrier substrate 600. FIG. 5K is a cross-sectional view illustrating another semiconductor device 100A, in accordance with some embodiments of the disclosure FIG. 5L a cross-sectional view illustrating removing the first carrier substrate 600 of the semiconductor device 100A of FIG. 5K, in accordance with some embodiments of the disclosure. Similar or identical elements will be denoted by similar or identical symbols.

Figure 5A:
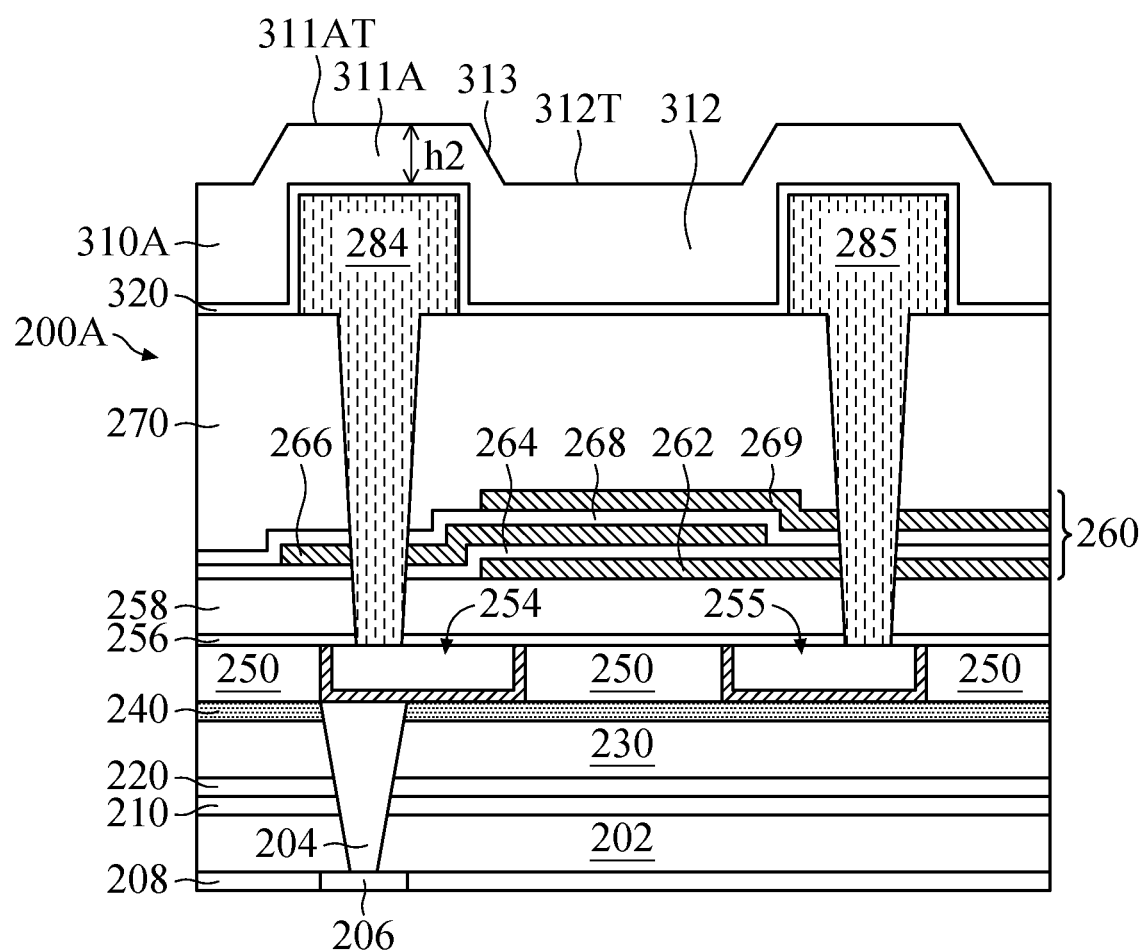
FIGS. 5A-5I are cross-sectional views illustrating various stages of forming another first semiconductor wafer, in accordance with some embodiments of the disclosure.

Various layers including conductive layers and insulating layers are formed over the substrate 202, for example, a first passivation layer 310A is formed over the insulating layer 270 and the upper contact features 284, 285, and the first passivation layer 310A is planarized (such as using a CMP process), as shown in FIG. 5A in accordance with some embodiments. In some embodiments, before the first passivation layer 310A is formed, the second passivation layer 320 may be formed over the upper contact features 284, 285.

Figure 5B:
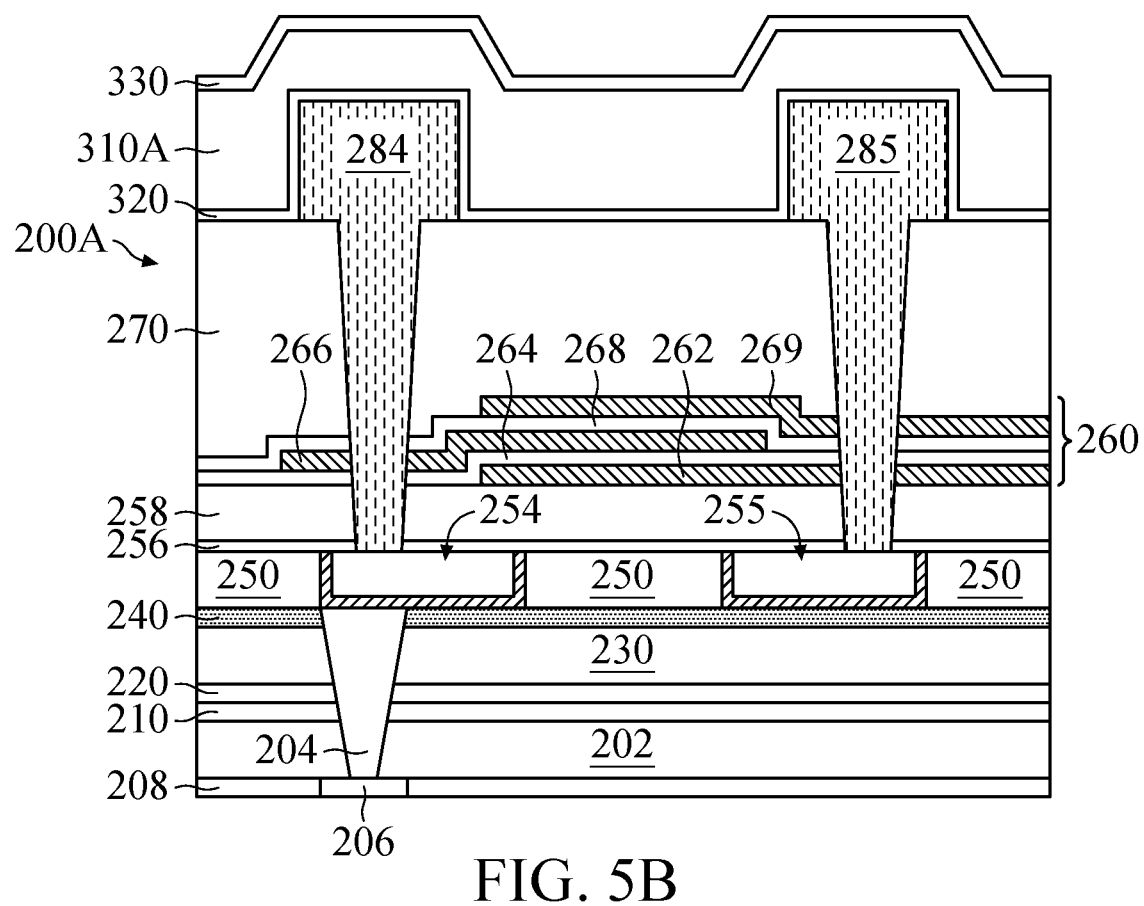
Figure 5C:
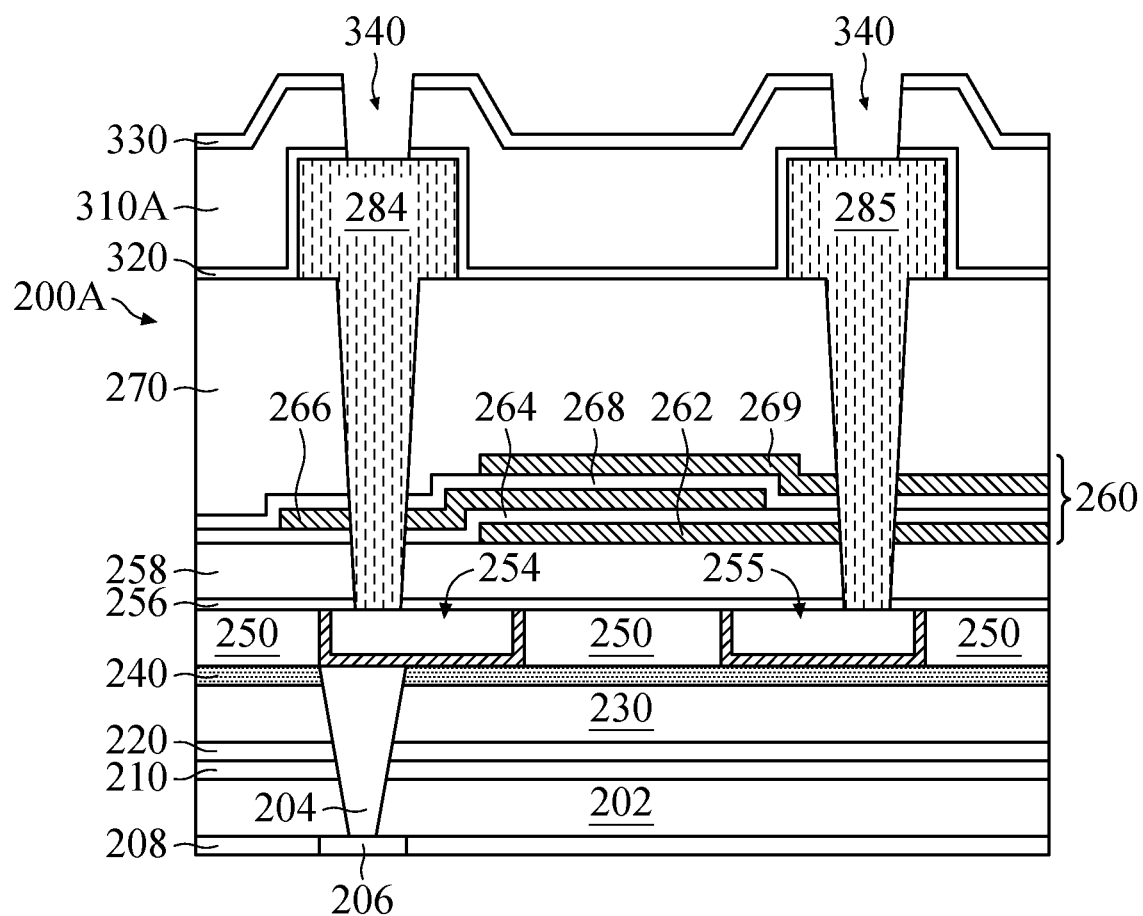
Figure 5D:
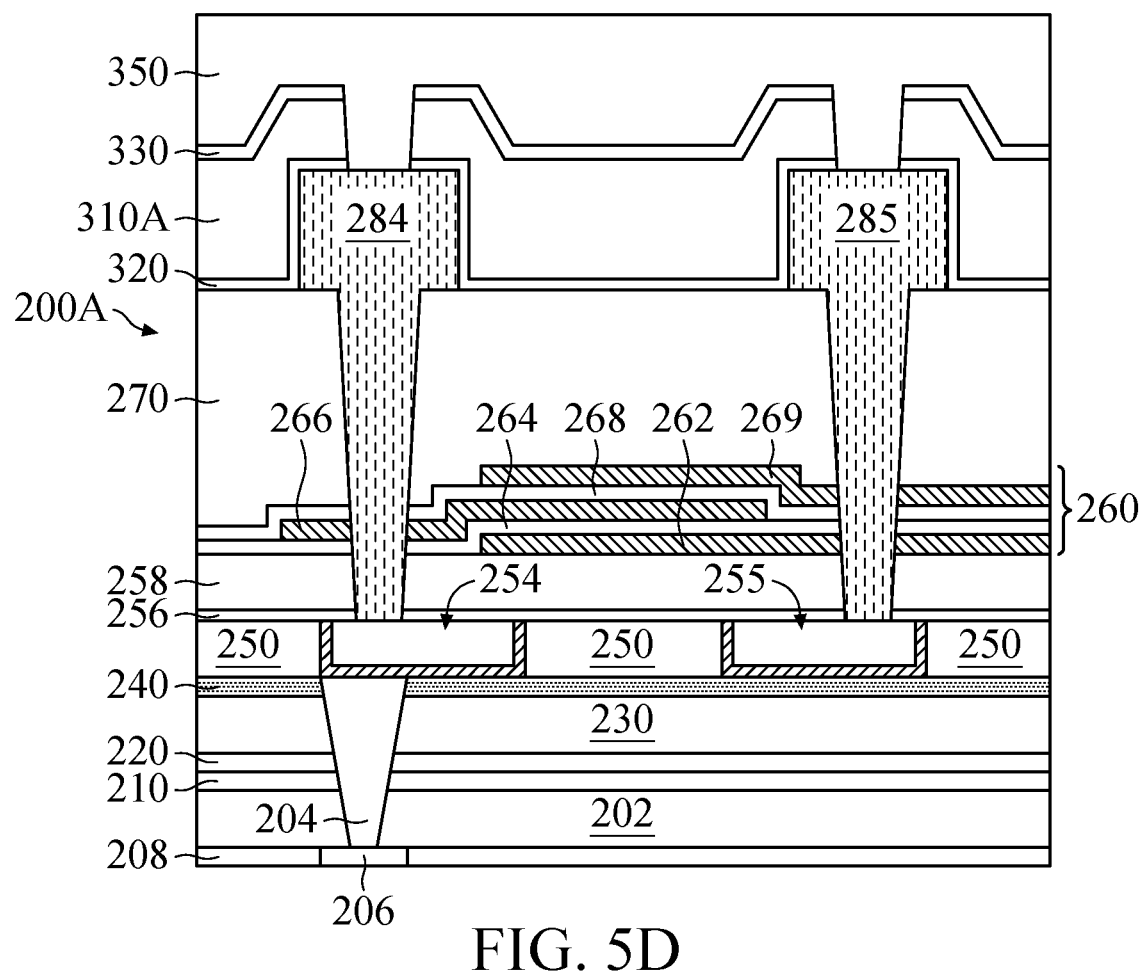
Figure 5E:
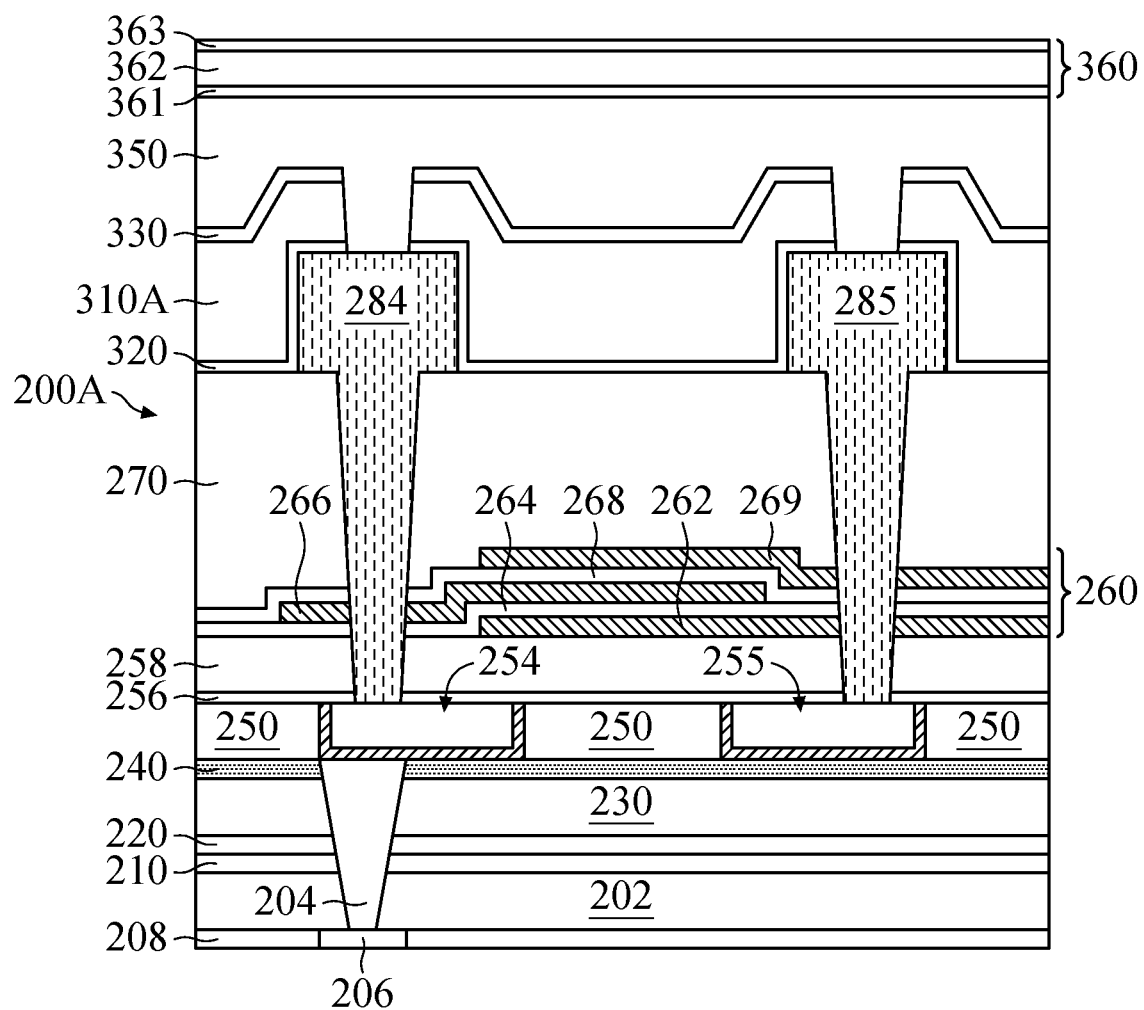

The third passivation layer 330 is formed over the first passivation layer 310, as shown in FIG. 5B in accordance with some embodiments. Then, the third passivation layer 330, the first passivation layer 310, and the second passivation layer 320 are etched to form a trench 340 that exposes the top surfaces the upper contact features 284, 285, as shown in FIG. 5C in accordance with some embodiments. The oxide layer 350 is formed over the third passivation layer 330, the first passivation layer 310, the second passivation layer 320, the upper contact features 284, 285, and in the trench 340, as shown in FIG. 5D in accordance with some embodiments. The first non-conductive structure 360 is formed over the oxide layer 350, as shown in FIG. 5E in accordance with some embodiments.

Figure 5F:
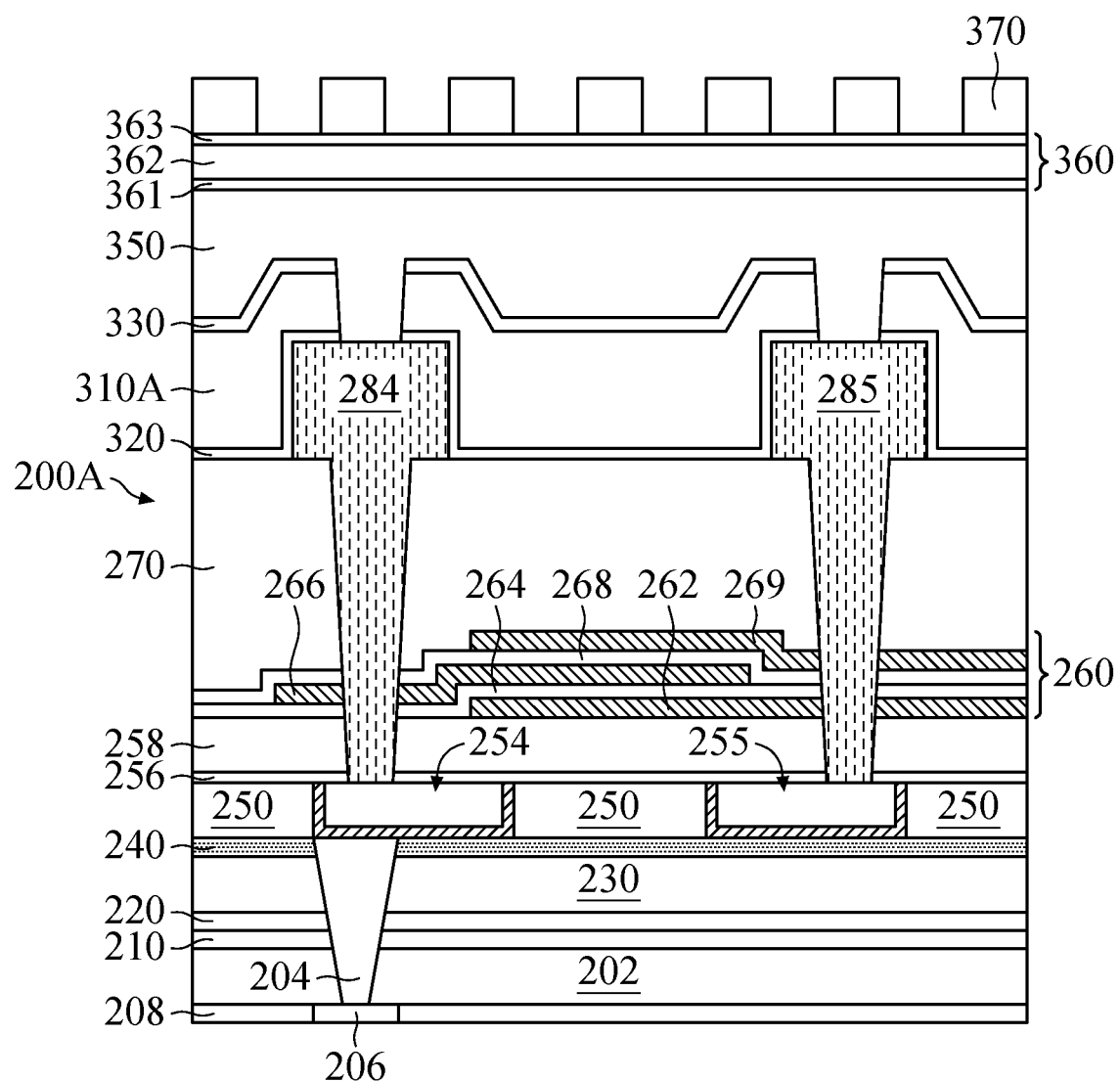
Figure 5G:
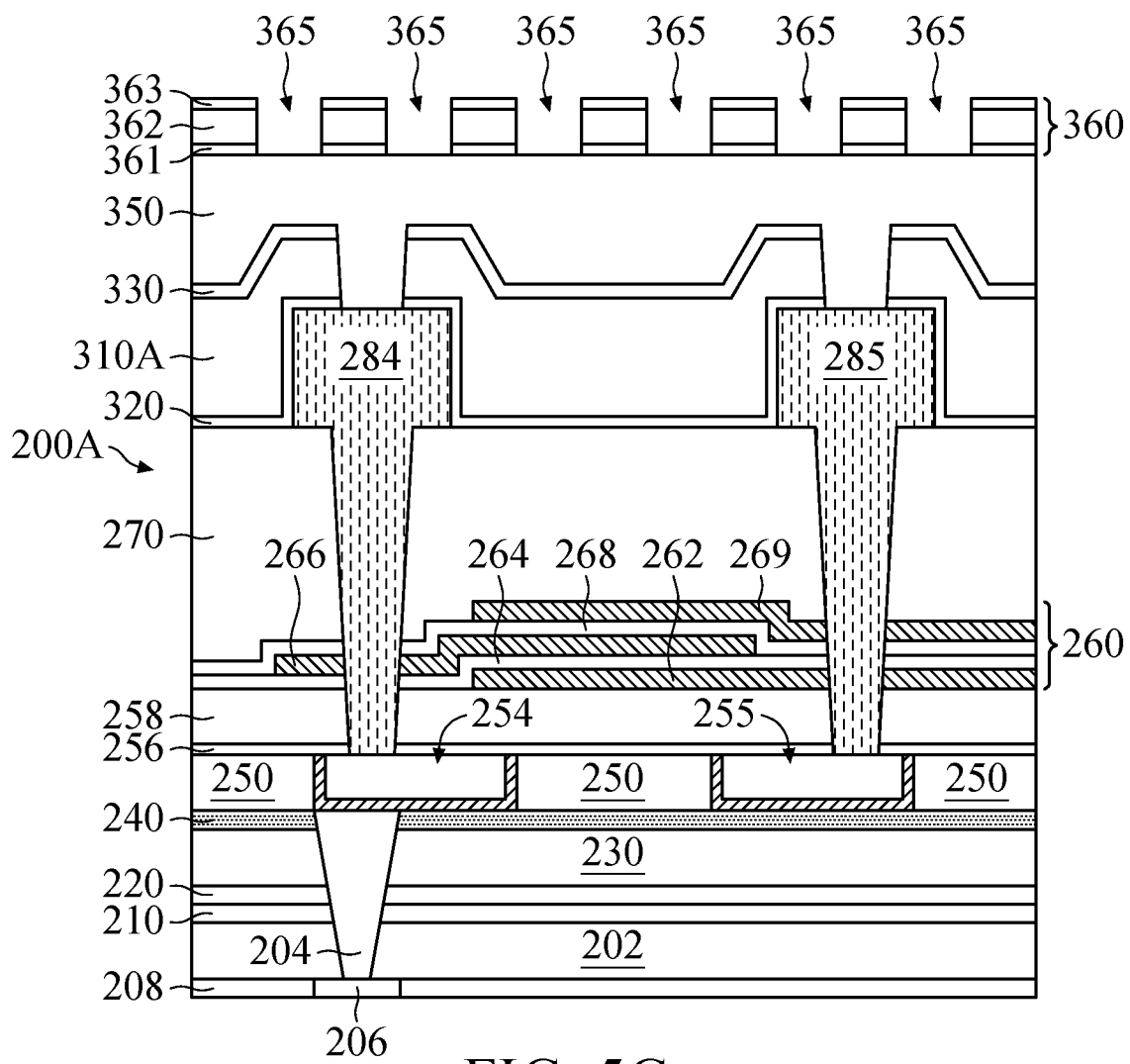
Figure 5H:
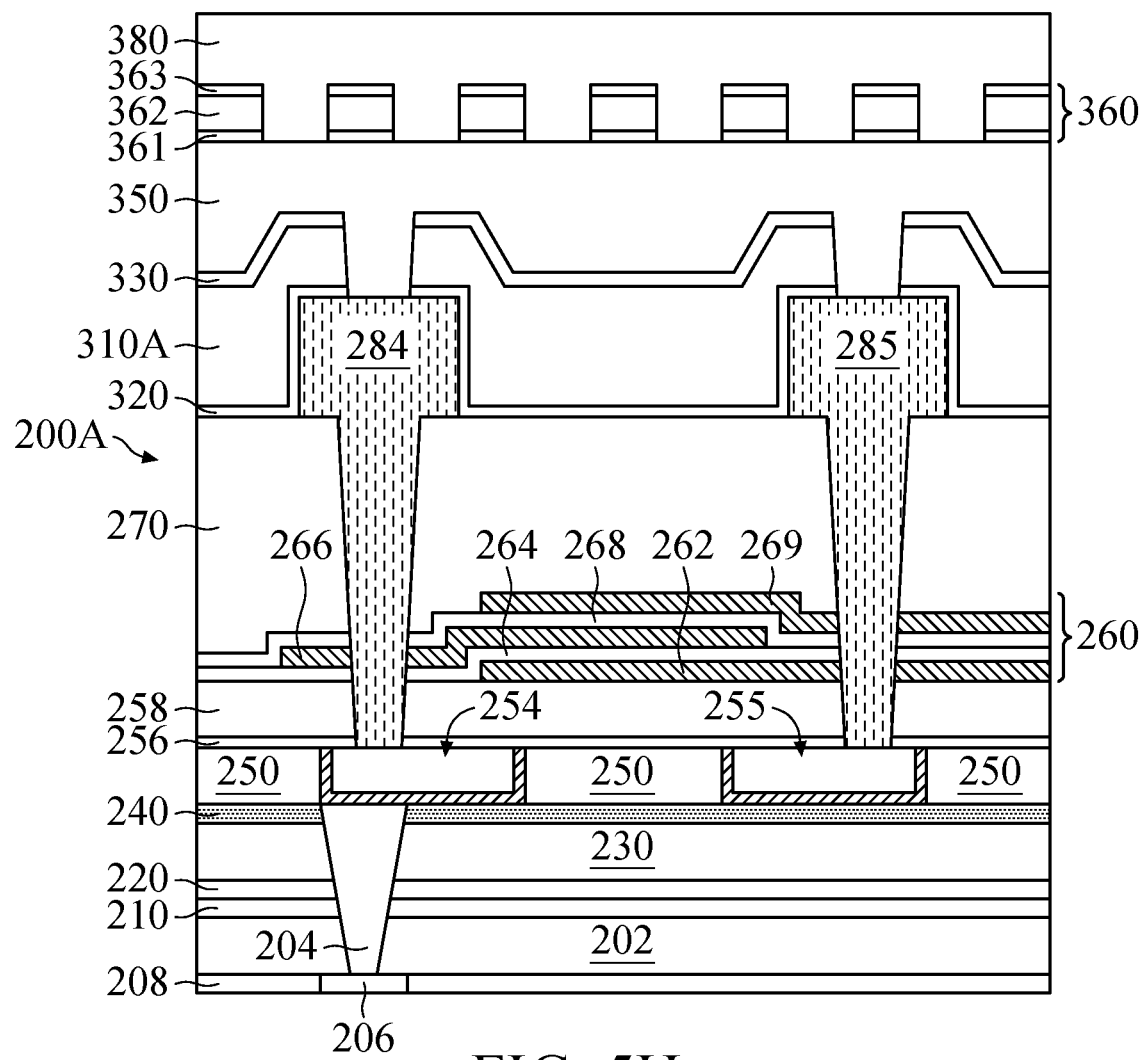
Figure 5I:
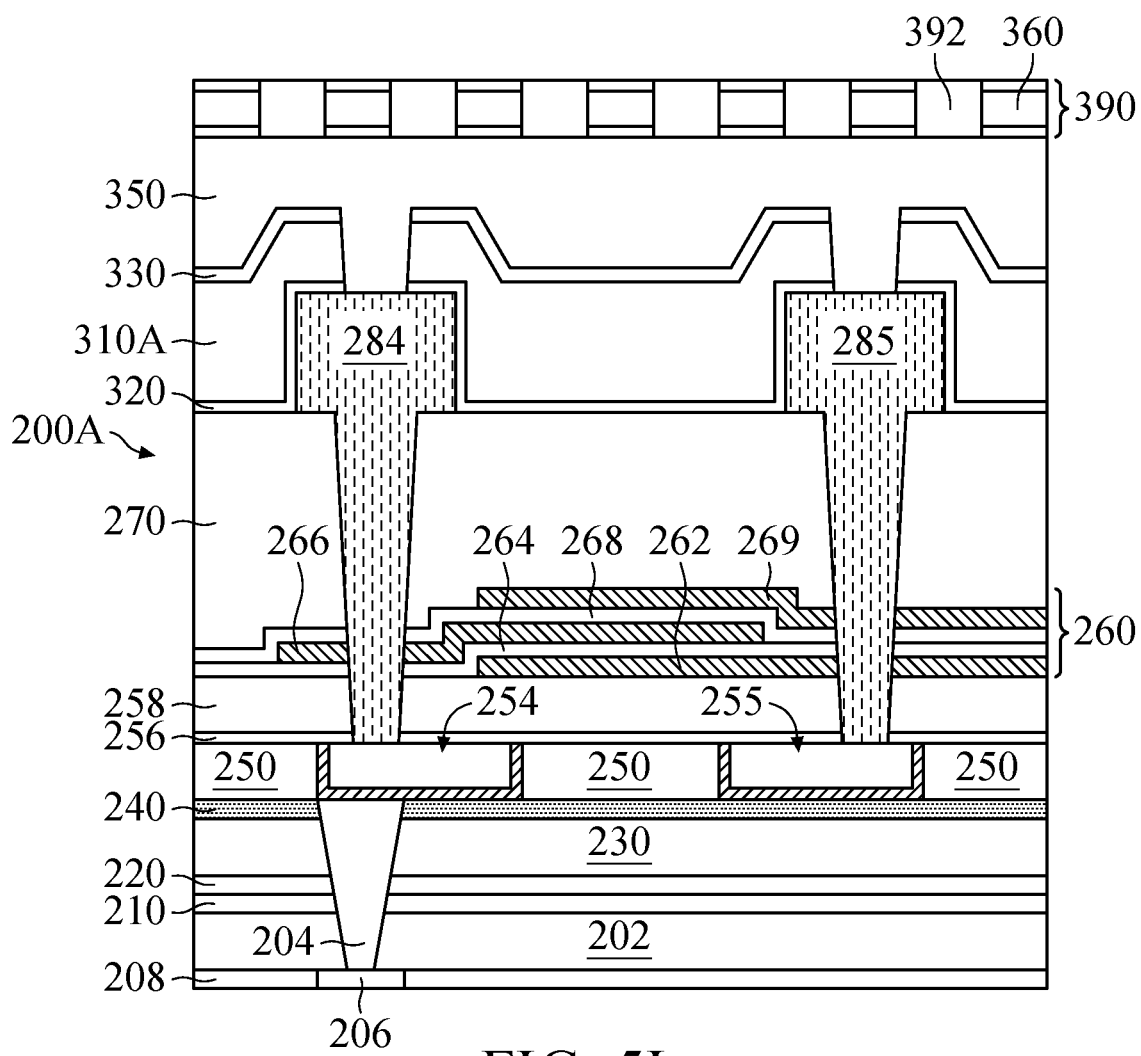
Figure 5J:
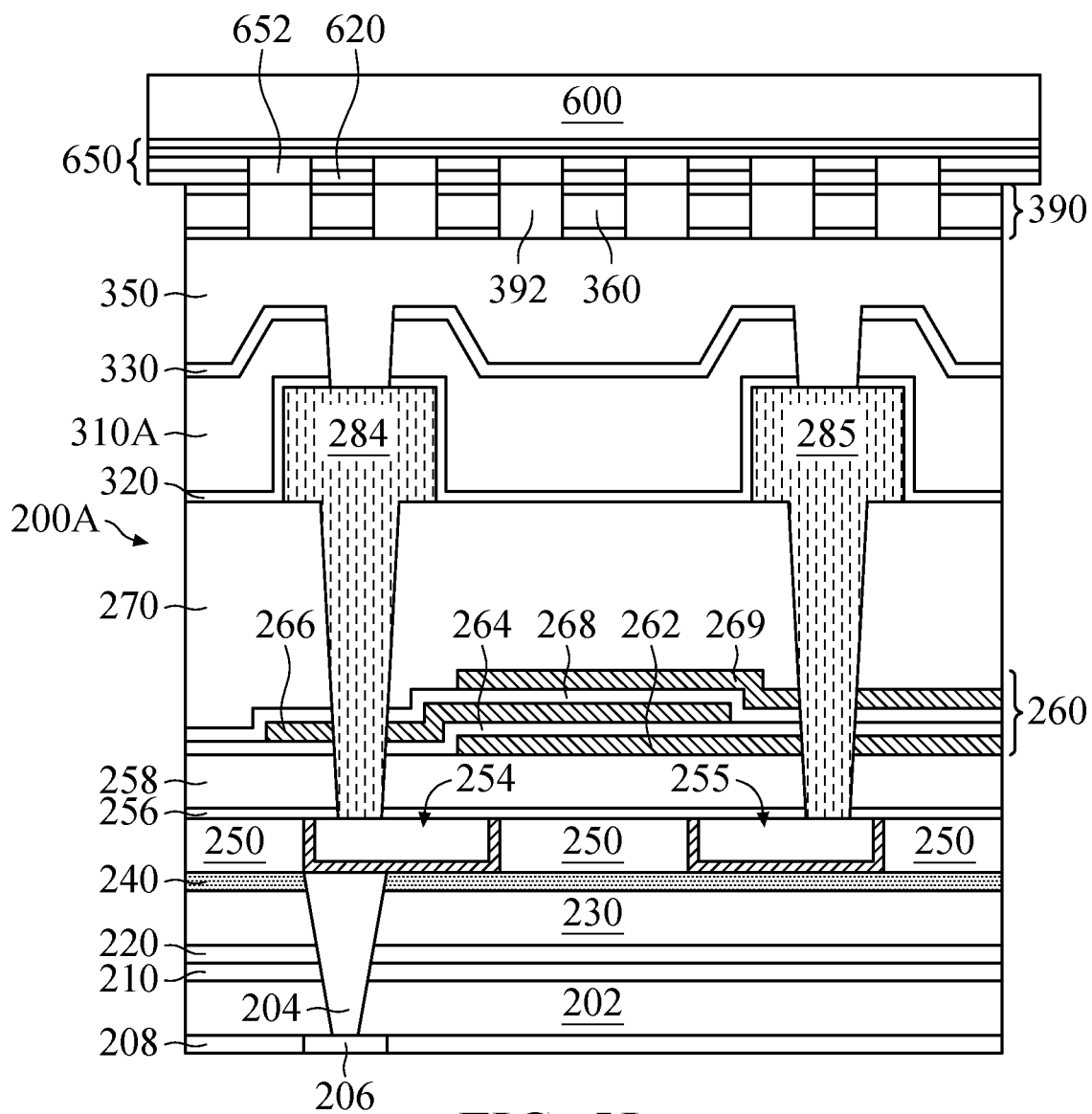
FIG. 5J is a cross-sectional view illustrating the first semiconductor wafer of FIG. 5I that is attached to the first carrier substrate.
Figure 5K:
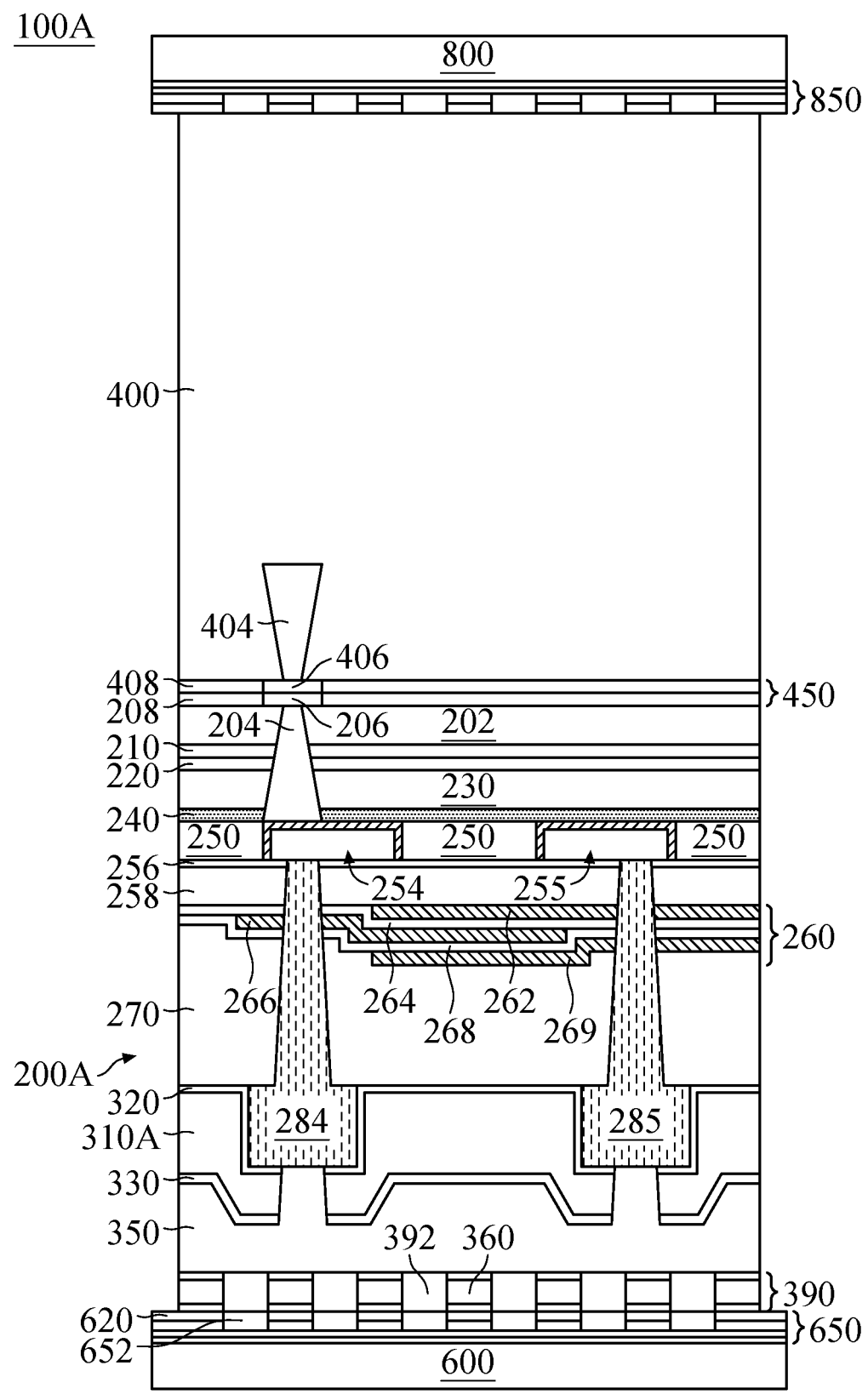
FIG. 5K is a cross-sectional view illustrating another semiconductor device, in accordance with some embodiments of the disclosure FIG. 5L a cross-sectional view illustrating removing the first carrier substrate of the semiconductor device of FIG. 5K, in accordance with some embodiments of the disclosure.
Figure 5L:
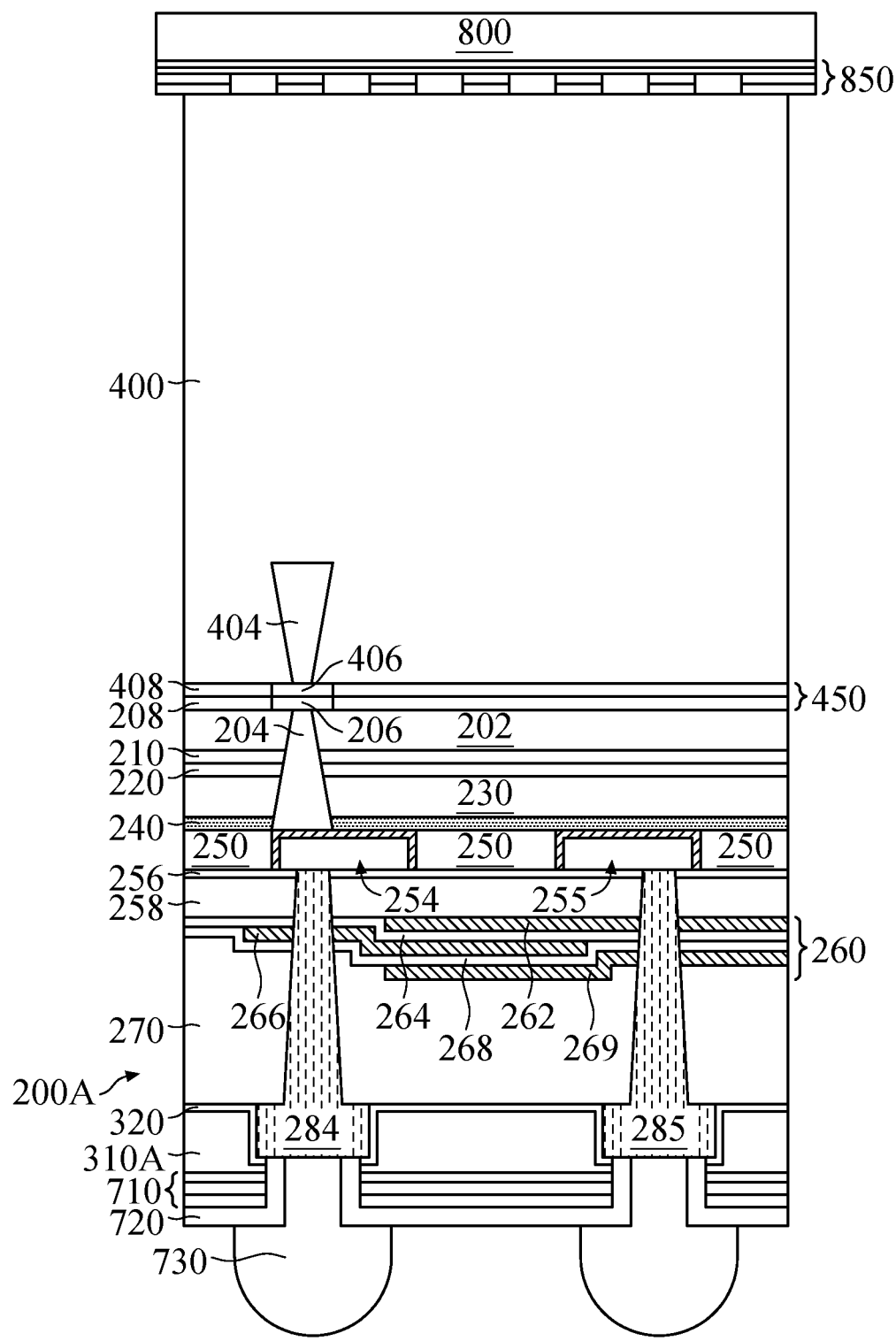

After the first non-conductive structure 360 is formed, the patterned etch mask layer 370 is formed over the first non-conductive structure 360, as shown in FIG. 5F in accordance with some embodiments. An etching process is performed using the patterned etch mask layer 370 as the mask to form the gaps 365 in the first non-conductive structure 360, as shown in FIG. 5G in accordance with some embodiments. After the gaps 365 are formed, the patterned etch mask layer 370 is removed in accordance with some embodiments. Afterwards, the conductive material 380 is formed over the first non-conductive structure 360 and in the gaps 365, as shown in FIG. 5H in accordance with some embodiments. Then, a planarization process (such as using a CMP process) may be used to remove part of the conductive material 380 until the conductive material 380 is substantially level with the top surface of the first non-conductive structure 360, as shown in FIG. 5I in accordance with some embodiments.

In short, one of the difference between the embodiments illustrated in FIGS. 5A-5L and the embodiments illustrated in FIGS. 1A-1K includes that the embodiments illustrated in FIGS. 5A-5L further includes planarizing (such as using a CMP process) the first passivation layer 310A before forming the oxide layer 350. Planarizing the first passivation layer 310A includes partially removing the first portion 311 of the first passivation layer 310A without removing the second portion 312 of the first passivation layer 310A. As shown in FIG. 1C and FIG. 5A, the distance d1 between the top surface 311T of the first portion 311 and the top surface of the second passivation layer 320 is greater than the distance d2 between the top surface 311AT of a first portion 311A and the top surface of the second passivation layer 320. In the embodiments illustrated in FIGS. 5A-5L, the surface topography of the upper contact features 284, 285 is reduced to an acceptable level.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

As described above, due to the passivation layer over the contact feature, the surface topography of the contact feature may be reduced. Furthermore, the bonding structure including a conductive material and a non-conductive material may provide both covalent bonds and metallic bonds, so the wafer and the carrier substrate may bond together in a more stable way. Furthermore, the surface topography of the upper contact features is reduced during the formation of the bonding structures, thereby facilitating the following process.

In accordance with some embodiments, a method for forming a semiconductor structure is provided. The method includes forming a contact feature over an insulating layer, forming a first passivation layer over the contact feature, and etching the first passivation layer to form a trench exposing the contact feature. The method also includes forming an oxide layer over the contact feature and the first passivation layer and in the trench, forming a first non-conductive structure over the oxide layer, and patterning the first non-conductive structure to form a gap. The method further includes filling a conductive material in the gap to form a first conductive feature. The first non-conductive structure and the first conductive feature form a first bonding structure. The method further includes attaching a carrier substrate to the first bonding structure via a second bonding structure over the carrier substrate.

In accordance with some embodiments, a method for forming a semiconductor structure is provided. The method includes forming a contact feature over an insulating layer, and forming a first passivation layer over the contact feature. The first passivation layer has a first portion over the contact feature and a second portion over the insulating layer, and the top surface of the first portion is higher than the top surface of the second portion. The method also includes patterning the first portion of the first passivation layer to form a trench exposing the contact feature, forming an oxide layer covering both the first portion and the second portion of the first passivation layer and extending into the trench, and forming a first bonding structure over the oxide layer. The first bonding structure includes a first conductive feature embedded in the first non-conductive structure.

In accordance with some embodiments, a method for forming a semiconductor structure is provided. The method includes forming a first semiconductor wafer. Forming the first wafer includes forming a contact feature over an insulating layer and forming a first passivation layer over the contact feature. The first passivation layer has a first portion and a second portion, and a tapered sidewall connects a first top surface of the first portion and a second top surface of the second portion. Forming the first wafer also includes forming an oxide layer covering both the first portion and the second portion of the first passivation layer. The oxide layer includes an extending portion extending through the first portion of the first passivation layer. Forming the first wafer further includes forming a first bonding structure over the oxide layer. The method also includes attaching the first semiconductor wafer to a first carrier substrate via the first bonding structure and a second bonding structure over the first carrier substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a contact feature over an insulating layer;
   forming a first passivation layer over the contact feature;
   etching the first passivation layer to form a trench exposing the contact feature;
   forming an oxide layer over the contact feature and the first passivation layer and in the trench;
   forming a first non-conductive structure over the oxide layer;
   patterning the first non-conductive structure to form a gap;
   filling a conductive material in the gap to form a first conductive feature, wherein the first non-conductive structure and the first conductive feature form a first bonding structure; and
   attaching a carrier substrate to the first bonding structure via a second bonding structure over the carrier substrate.

2. The method as claimed in claim 1, wherein the first conductive feature and the contact feature are electrically isolated.

3. The method as claimed in claim 1, further comprising performing an annealing process on the first passivation layer before the oxide layer is formed.

4. The method as claimed in claim 1, wherein a part of a profile of the oxide layer is trapezoidal.

5. The method as claimed in claim 1, further comprising:
   forming a second passivation layer over the contact feature before forming the first passivation layer, wherein a shape of the second passivation layer corresponds to a shape of the contact feature.

6. The method as claimed in claim 5, wherein a thickness of the first passivation layer is greater than a thickness of the second passivation layer.

7. The method as claimed in claim 5, further comprising forming a third passivation layer over the first passivation layer before forming the oxide layer, wherein the first passivation layer and the third passivation layer comprise different materials.

8. The method as claimed in claim 1, wherein attaching the carrier substrate to the first bonding structure via the second bonding structure over the carrier substrate is conducted at a temperature in a range from about 300° C. to about 600° C.

9. The method as claimed in claim 1, wherein the first non-conductive structure is a tri-layer structure.

10. A method for forming a semiconductor structure, comprising:
    forming a contact feature over an insulating layer;
    forming a first passivation layer over the contact feature, wherein the first passivation layer has a first portion over the contact feature and a second portion over the insulating layer, and a top surface of the first portion is higher than a top surface of the second portion;
    patterning the first portion of the first passivation layer to form a trench exposing the contact feature;
    forming an oxide layer covering both the first portion and the second portion of the first passivation layer and extending into the trench; and
    forming a first bonding structure over the oxide layer, wherein the first bonding structure comprises a first conductive feature embedded in a first non-conductive structure.

11. The method as claimed in claim 10, wherein forming the first bonding structure over the oxide layer comprises:
    depositing a tri-layer structure over the oxide layer to form the first non-conductive structure;
    patterning the first non-conductive structure to form a gap;
    depositing a conductive material over the first non-conductive structure and the oxide layer and in the gap; and
    planarizing the conductive material until a top surface of the first non-conductive structure is exposed, forming the first conductive feature in the gap.

12. The method as claimed in claim 11, further comprising:
    depositing a bottom structure over a carrier substrate;

depositing a second non-conductive structure over the bottom structure;

patterning the second non-conductive structure to form an opening, wherein the bottom structure is exposed by the opening; and filling the conductive material in the opening to form a second conductive feature, wherein the second non-conductive structure and the second conductive feature form a second bonding structure; and attaching the carrier substrate to the first bonding structure via the second bonding structure over the carrier substrate.

13. The method as claimed in claim 12, wherein a number of layers of the bottom structure is identical to a number of layers of the second non-conductive structure.

14. The method as claimed in claim 12, wherein the first conductive feature is in direct contact with the second conductive feature.

15. The method as claimed in claim 12, wherein the first conductive feature is aligned with the second conductive feature.

16. The method as claimed in claim 12, wherein filling the conductive material in the opening comprises:

depositing the conductive material over the second non-conductive structure and in the opening; and planarizing the conductive material until the conductive material is substantially level with the second non-conductive structure.

17. A method for forming a semiconductor structure, comprising:

forming a first semiconductor wafer, comprising:

forming a contact feature over an insulating layer;

forming a first passivation layer over the contact feature, wherein the first passivation layer has a first portion and a second portion, and a tapered sidewall connects a first top surface of the first portion and a second top surface of the second portion;

forming an oxide layer covering both the first portion and the second portion of the first passivation layer, wherein the oxide layer comprises an extending portion extending through the first portion of the first passivation layer; and forming a first bonding structure over the oxide layer; and attaching the first semiconductor wafer to a first carrier substrate via the first bonding structure and a second bonding structure over the first carrier substrate.

18. The method as claimed in claim 17, further comprising planarizing the first passivation layer before forming the oxide layer, wherein planarizing the first passivation layer comprises partially removing the first portion of the first passivation layer without removing the second portion of the first passivation layer.

19. The method as claimed in claim 17, further comprising:

attaching a second semiconductor wafer to a second carrier substrate via a third bonding structure;

bonding the first semiconductor wafer to the second semiconductor wafer via a fourth bonding structure;

wherein a TSV in the first semiconductor wafer is electrically connected to a metallization structure in the second semiconductor wafer, wherein the first semiconductor wafer and the first carrier substrate are electrically isolated, the second semiconductor wafer and the second carrier substrate are electrically isolated, and the first semiconductor wafer and the second semiconductor wafer are electrically connected, wherein the first bonding structure, the second bonding structure, the third bonding structure, and the fourth bonding structure all comprise a conductive feature embedded in a non-conductive structure.

20. The method as claimed in claim 17, further comprising:

polishing the first carrier substrate, the second bonding structure, and the first bonding structure until the first passivation layer of the first semiconductor wafer is exposed;

forming a post passivation layer over the first passivation layer;

etching the post passivation layer to form a post trench exposing the contact feature;

forming a polymeric layer over the post passivation layer and on a sidewall of the post trench; and forming a conducive bump in the post trench.

* * * * *